(12) United States Patent
Kim et al.

(10) Patent No.: US 9,889,556 B2
(45) Date of Patent: Feb. 13, 2018

(54) LINK STRUCTURE

(71) Applicant: SAMSUNG ELECTRONICS CO., LTD., Suwon-si (KR)

(72) Inventors: Sun-Ho Kim, Seoul (KR); Ki-Hoon Nam, Suwon-si (KR); Tae-Min Earmme, Seoul (KR); Seok Heo, Hwaseong-si (KR); Jae-Chul Hwang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 421 days.

(21) Appl. No.: 14/661,688

(22) Filed: Mar. 18, 2015

(65) Prior Publication Data
US 2015/0360373 A1    Dec. 17, 2015

(30) Foreign Application Priority Data

Jun. 11, 2014    (KR) .......................... 10-2014-0071024

(51) Int. Cl.
| | |
|---|---|
| *A01B 1/00* | (2006.01) |
| *B25J 9/04* | (2006.01) |
| *B25J 9/10* | (2006.01) |
| *H01L 21/677* | (2006.01) |

(52) U.S. Cl.
CPC ............... *B25J 9/042* (2013.01); *B25J 9/107* (2013.01); *B25J 9/1065* (2013.01); *H01L 21/67742* (2013.01); *Y10S 901/15* (2013.01); *Y10T 74/20305* (2015.01)

(58) Field of Classification Search
CPC .......... B25J 9/042; B25J 9/1065; B25J 9/107; H01L 21/67742
See application file for complete search history.

(56) References Cited

U.S. PATENT DOCUMENTS

| | | | |
|---|---|---|---|
| 5,151,008 A * | 9/1992 | Ishida | .................... B25J 9/0084 |
| | | | 414/744.5 |
| 6,099,238 A | 8/2000 | Tsubota | |
| 6,450,757 B1 * | 9/2002 | Saeki | .................... B25J 9/1065 |
| | | | 414/744.5 |
| 6,558,107 B1 * | 5/2003 | Okuno | .................... B25J 9/107 |
| | | | 414/744.5 |
| 6,675,069 B2 | 1/2004 | Uratani | |
| 7,001,139 B2 | 2/2006 | Mori et al. | |

(Continued)

FOREIGN PATENT DOCUMENTS

| | | |
|---|---|---|
| JP | 10-329059 A | 12/1998 |
| JP | 2000-195923 A | 7/2000 |

(Continued)

*Primary Examiner* — David M Fenstermacher
(74) *Attorney, Agent, or Firm* — Sughrue Mion, PLLC

(57) ABSTRACT

A link structure includes a first link, a second link having an end that is connected to an end of the first link, a third link having an end that is connected to the end of the first link, and provided on a portion of the second link, a first rotary shaft partially provided in the first link, a first actuator configured to rotate the first link about the first rotary shaft; a second rotary shaft partially provided in the second link, the second rotary shaft being different from the first rotary shaft, and a second actuator configured to rotate the second link about the second rotary shaft, the first and second actuators being provided in the first link.

19 Claims, 27 Drawing Sheets

(56) References Cited

U.S. PATENT DOCUMENTS

| | | | |
|---|---|---|---|
| 7,244,091 B2 | 7/2007 | Mori et al. | |
| 7,563,068 B2 * | 7/2009 | Niewmierzycki | H01L 21/67742 414/806 |
| 7,665,950 B2 | 2/2010 | Uratani et al. | |
| 7,752,939 B2 | 7/2010 | Ono | |
| 7,967,549 B2 * | 6/2011 | Geist | B25J 9/042 414/744.5 |
| 8,393,243 B2 * | 3/2013 | Ono | B25J 9/042 414/680 |
| 8,434,387 B2 | 5/2013 | Nakagiri et al. | |
| 8,677,854 B2 * | 3/2014 | Lundberg | B25J 9/04 74/490.01 |
| 8,701,518 B2 * | 4/2014 | Chen | G05G 11/00 74/490.01 |
| 8,950,967 B2 * | 2/2015 | Van Ham | B25J 19/0016 403/111 |
| 8,953,298 B2 * | 2/2015 | Kao | H01L 21/67742 361/234 |
| 2008/0028883 A1 | 2/2008 | Inada et al. | |
| 2012/0076626 A1 | 3/2012 | Hoey et al. | |
| 2013/0145892 A1 | 6/2013 | Ono | |

FOREIGN PATENT DOCUMENTS

| | | |
|---|---|---|
| JP | 2002-66966 A | 3/2002 |
| JP | 4490341 B2 | 6/2010 |
| JP | 4615760 B2 | 1/2011 |
| JP | 2011-218525 A | 11/2011 |
| JP | 2012-30361 A | 2/2012 |
| JP | 2012-186389 A | 9/2012 |
| KR | 2003-0045627 A | 6/2003 |
| KR | 10-2007-0027695 A | 3/2007 |
| KR | 10-2007-0042468 A | 4/2007 |
| KR | 10-0866094 B1 | 10/2008 |
| KR | 10-2012-0129535 A | 11/2012 |
| WO | 2009/134006 A1 | 11/2009 |

\* cited by examiner

LINK STRUCTURE

CROSS-REFERENCE TO RELATED APPLICATION

This application is based on and claims priority from Korean Patent Application No. 10-2014-0071024, filed on Jun. 11, 2014 in the Korean Intellectual Property Office, the disclosure of which is incorporated herein in its entirety by reference.

BACKGROUND

1. Field

The exemplary embodiments relate to a link structure, and more specifically, a link structure used during manufacturing of semiconductors.

2. Description of the Prior Art

During a semiconductor manufacturing process, a vacuum robot arm may be required to transport a glass substrate and a mask in a vacuum environment. Generally, according to a related art vacuum robot arm, a rotary shaft is sealed by a magnetic fluid seal, and components for driving are sealed in the robot arm. Accordingly, there may be limitations in implementing a high-rigidity robot arm at low cost. Further, the high-rigidity robot arm may be required in order to precisely transport a mask that is formed of a heavy material, and thus, the weight of the robot arm may be required to be increased and the components may be required to be large. For such reasons, there is a need for a robot arm that can move with three degrees of freedom and can independently implement not only forward and backward motion but also left and right motion to transport material within or near a process chamber structure.

SUMMARY

Accordingly, the exemplary embodiments may solve the above-mentioned problems occurring in the related art, and an aspect of an exemplary embodiment may provide a link structure, which can enable an apparatus to move with three degrees of freedom using the link structure, and can minimize the utilization of a magnetic fluid seal to reduce the manufacturing costs.

Additional advantages, subjects, and features of the exemplary embodiments will be set forth in part in the description which follows and in part will become apparent to those having ordinary skill in the art upon examination of the following teachings or may be learned from practice of the exemplary embodiments.

According to an aspect of an exemplary embodiment, there is provided a link structure, including: a first link, a second link having an end that is connected to an end of the first link, a third link having an end that is connected to the end of the first link, a third link having an end that is connected to the end of the first link, and provided on a portion of the second link, a first rotary shaft partially provided in the first link, a first actuator configured to rotate the first link about the first rotary shaft; a second rotary shaft partially provided in the second link, the second rotary shaft being different from the first rotary shaft, and a second actuator configured to rotate the second link about the second rotary shaft, wherein the first and second actuators are provided in the first link.

According to another aspect of an exemplary embodiment, there may be provided a link structure, including: a first link, a second link having an end that is connected to an end of the first link, a third link having an end that is connected to the end of the first link, and provided on a portion of the second link, a fourth link having an end that is connected to another end of the second link, and provided on the portion of the second link, a first rotary shaft partially provided in the first link, a first actuator configured to rotate the first link about the first rotary shaft; a second rotary shaft partially provided in the second link, the second rotary shaft being different from the first rotary shaft, and a second actuator configured to rotate the second link rotate about the second rotary shaft, wherein the first and second actuators are provided in the first link.

BRIEF DESCRIPTION OF THE DRAWINGS

The above and other objects, features and advantages of the exemplary embodiments will be more apparent from the following detailed description taken in conjunction with the accompanying drawings, in which.

DETAILED DESCRIPTION OF THE EXEMPLARY EMBODIMENTS

Figure 1:
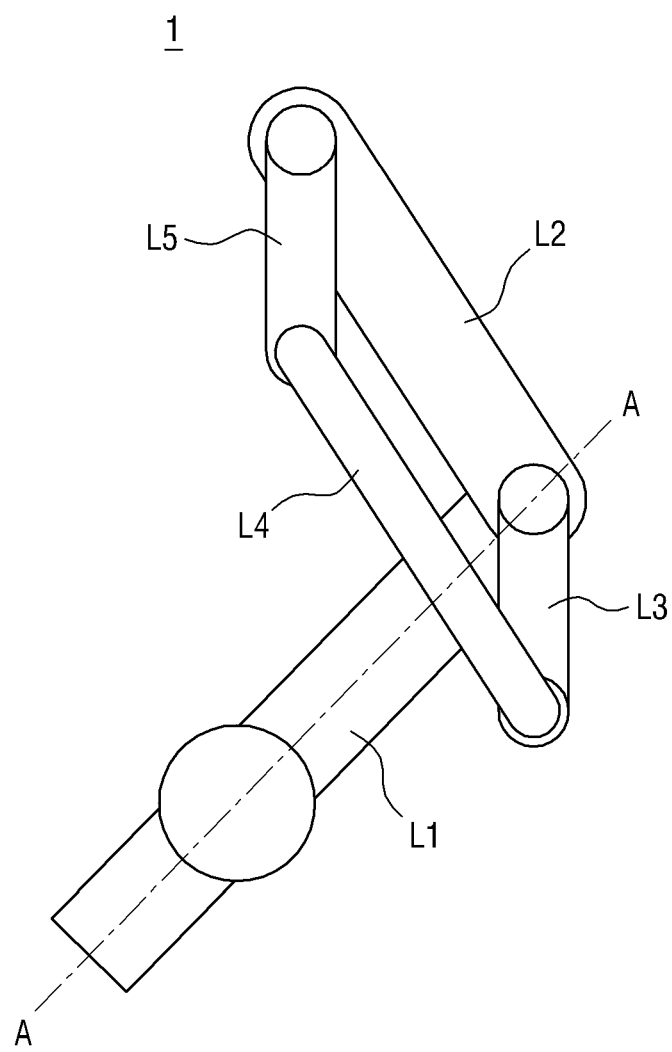
FIG. 1 is a conceptual view explaining a link structure according to an exemplary embodiment.

Advantages and features of the exemplary embodiments may be understood more readily by reference to the following detailed description of exemplary embodiments and the accompanying drawings. The present inventive concept may, however, be embodied in many different forms and should not be construed as being limited to the exemplary embodiments set forth herein. Rather, these exemplary embodiments are provided so that this disclosure will be thorough and complete and will fully convey the concept of the inventive concept to those skilled in the art, and aspects of the inventive concept will only be defined by the appended claims. Like reference numerals refer to like elements throughout the specification.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, the element can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, referring to FIGS. 1 to 7, a link structure according to an exemplary embodiment will be described.

Figure 2:
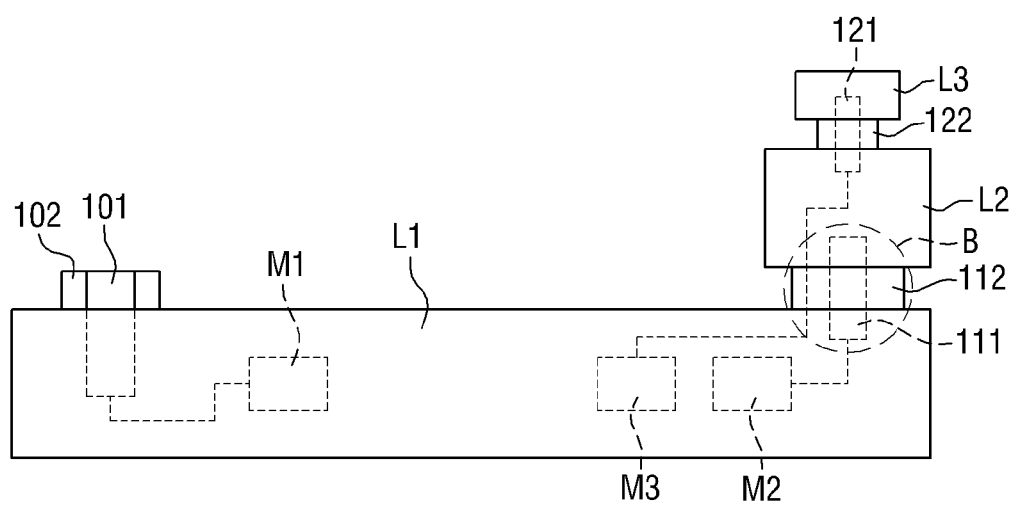
FIG. 2 is a cross-sectional view cut along line A-A of FIG. 1.
Figure 3:
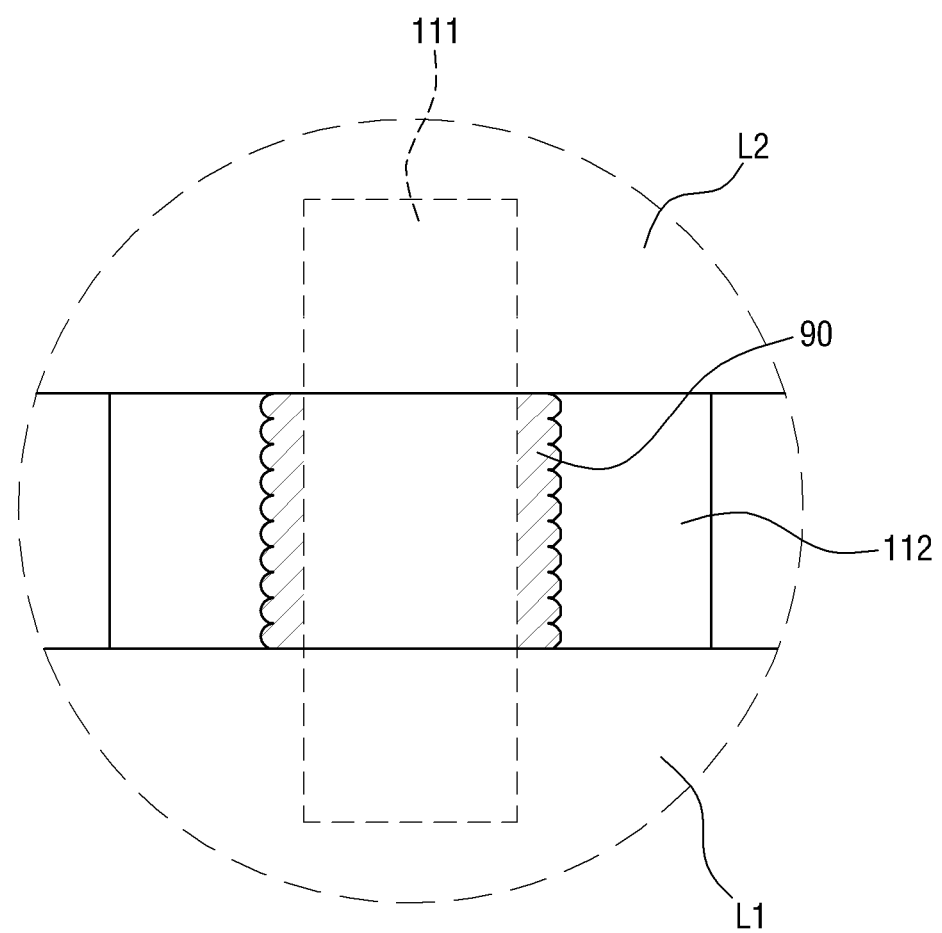
FIG. 3 is an enlarged view of portion B of FIG. 2.
Figure 4:
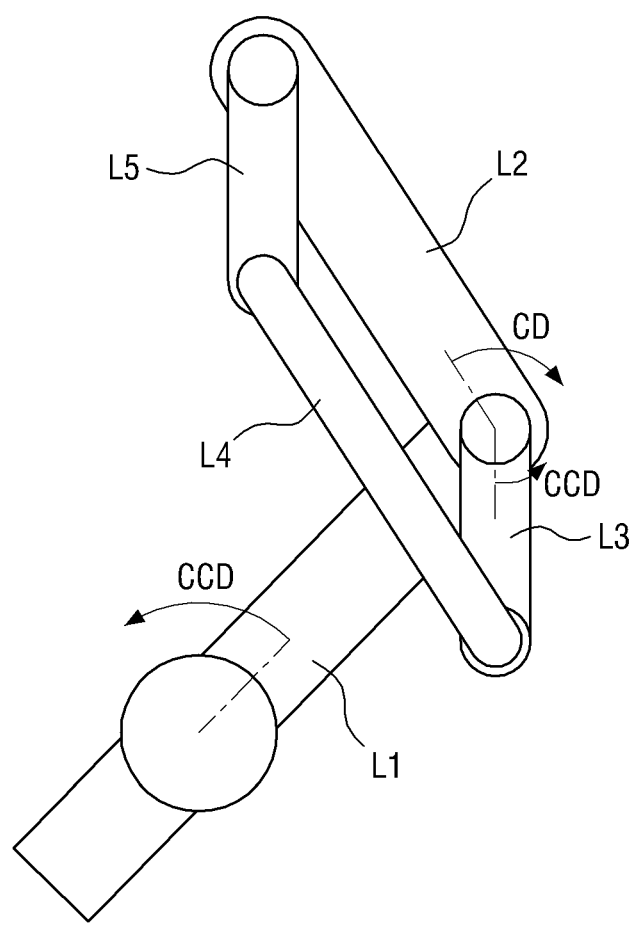
FIGS. 4 and 5 are views explaining an example of the operation of the link structure of FIG. 1.
Figure 5:
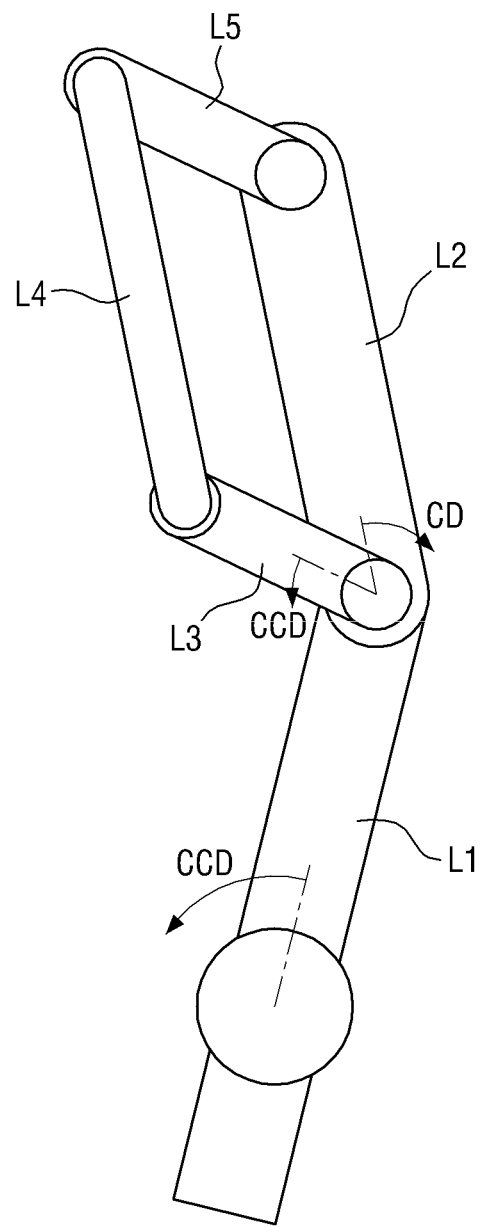
Figure 6:
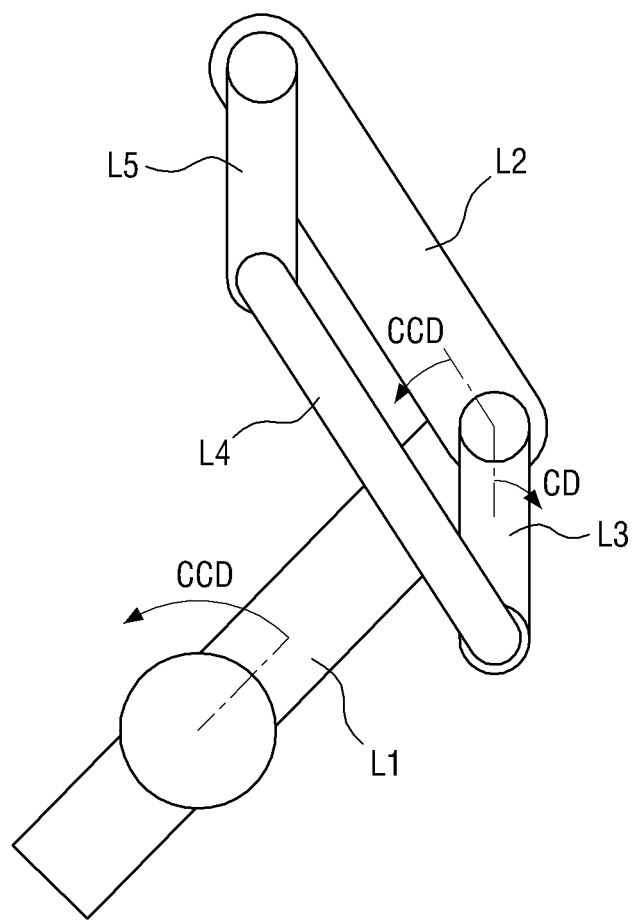
FIGS. 6 and 7 are views explaining another example of the operation of the link structure of FIG. 1.
Figure 7:
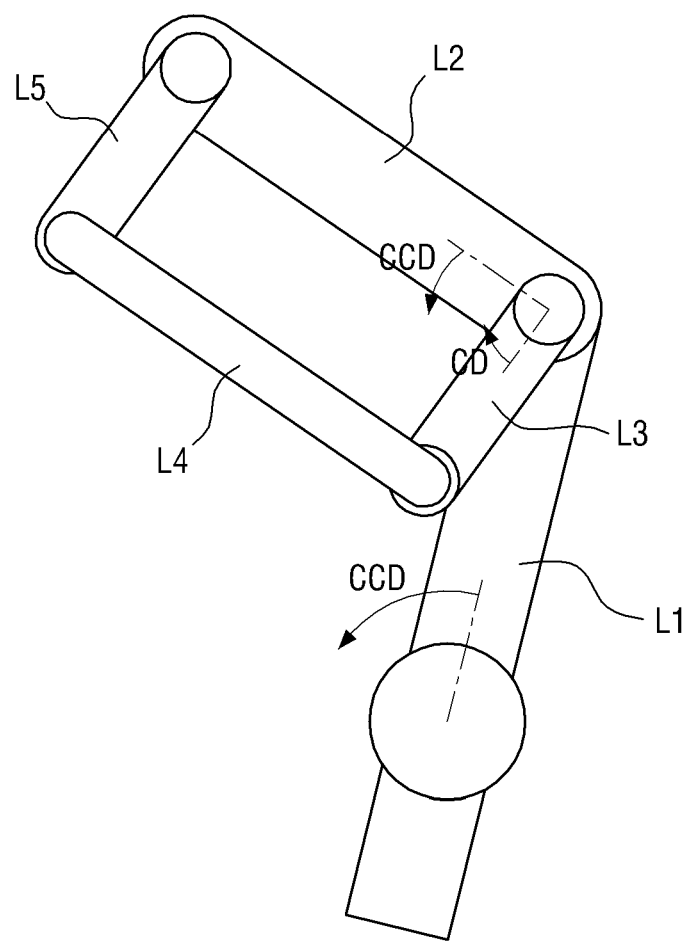

FIG. 1 is a conceptual view explaining a link structure according to an exemplary embodiment. FIG. 2 is a cross-sectional view cut along line A-A of FIG. 1, and FIG. 3 is an enlarged view of portion B of FIG. 2. FIGS. 4 and 5 are views explaining an example of the operation of the link structure of FIG. 1, and FIGS. 6 and 7 are views explaining another example of the operation of the link structure of FIG. 1.

First, referring to FIG. 1, a link structure 1 according to an exemplary embodiment may include first to fifth links L1, L2, L3, L4 and L5.

The first link L1 may include first, second and third actuators M1, M2 and M3 (in FIG. 2) and may be operated by the first actuator M1. Further, the first link L1 may be connected to the second link L2 and the first link L1 and the second link L2 may be main links that serve to support the load of a transported material. The first to third actuators M1, M2 and M3 may each include, for example, a motor, but are not limited thereto.

Since the first link L1 includes the actuators M1 to M3 (in FIG. 2), the interior of the first link L1 should be kept in an atmospheric state. Accordingly, the interior of the first link L1 may be kept in the atmospheric state, and in order to maintain the atmospheric state, a magnetic fluid seal may be used. This feature will be described in detail later.

In addition, since the first link L1 includes the actuators M1 to M3 (in FIG. 2) therein, the first link L1 may be thicker than the other links L2, L3, L4 and L5, but is not limited thereto.

Referring to FIG. 2, the first actuator M1 may be positioned in the first link L1 and may be connected to a first rotary shaft 101. Further, the first actuator M1 may drive, e.g., rotate the first link L1 through rotation of the first rotary shaft 101.

A part of the first rotary shaft 101 may be positioned in the first link L1, and the remaining part thereof may be positioned outside of the first link L1. The first rotary shaft 101 that projects to an outside may be surrounded by a first cover 102, and a magnetic fluid seal may be positioned between the first rotary shaft 101 and the first cover 102, but is not limited thereto.

Further, the second actuator M2 may be positioned in the first link L1 and may be connected to a second rotary shaft 111. Further, the second actuator M2 may drive, e.g., rotate the second link L2 through rotation of the second rotary shaft 111.

The second rotary shaft 111 may connect the first link L1 and the second link L2 to each other. One end of the second rotary shaft 111 may be positioned in the first link L1, and the other end thereof may be positioned in the second link L2. Further, a part of the second rotary shaft 111 that is positioned between the first link L1 and the second link L2 may be surrounded and sealed by a second cover 112.

Further, the magnetic fluid seal may be positioned between the second cover 112 and the second rotary shaft 111, but is not limited thereto.

As illustrated in FIG. 3, the part of the second rotary shaft 111 that is positioned between the first link L1 and the second link L2 is surrounded by the magnetic fluid seal 90.

That is, the part of the second rotary shaft 111 that is positioned between the first link L1 and the second link L2 may be surrounded and sealed by the second cover 112, and if the second rotary shaft 111 is continuously rotated by the second actuator M2, a space may be formed between the second rotary shaft 111 and the second cover 112 and thus the atmospheric state may not be maintained in the first link L1.

In order to prevent this deviation in the atmospheric state, the magnetic fluid seal 90 may be inserted between the second rotary shaft 111 and the second cover 112 to keep the atmospheric state in the first link L1.

Referring again to FIG. 2, the third actuator M3 may be positioned in the first link L1 and may be connected to a third rotary shaft 121. Further, the third actuator M3 may drive, e.g., rotate the third link L3 through rotation of the third rotary shaft 121.

The third rotary shaft 121 may connect the second link L2 and the third link L3 to each other. One end of the third rotary shaft 121 may be positioned in the second link L2, and the other end thereof may be positioned in the third link L3. Further, a part of the third rotary shaft 121 that is positioned between the second link L2 and the third link L3 may be surrounded and sealed by a third cover 122.

The third link L3 may be a sub-link that constitutes a four-bar link together with the fourth and fifth links L4 and L5. The details of the fourth and fifth links L4 and L5 will be described later.

Referring again to FIG. 1, one end of the second link L2 may be connected to one end of the first link L1 and may be operated by the second actuator M2. As described above, the first link L1 and the second link L2 may be main links that support the load of the transported material.

Specifically, the second link L2 may be connected to the first link L1 to serve as the main link that supports the load of the transported material, and may be connected to the third and fifth links L3 and L5. That is, the second link L2 may constitute the four-bar link together with the third to fifth links L3, L4, and L5.

One end of the third link L3 may be connected to one end of the first link L1, and may be provided on an upper portion of the second link L2. Further, as described above, the third link L3 may be operated by the third actuator M3.

Specifically, one end of the third link L3 may be connected to one end of the second link L2, and the other end thereof may be connected to the fourth link L4. Further, the third link L3 may be provided on the second link L2. As described above, the third link L3 may be connected between the second link L2 and the fourth link L4 to constitute the four-bar link.

Since the third link L3 is not a main link that supports the load of the transported material, but is a sub-link that constitutes the four-bar link, the third link L3 may have a thickness that is thinner than the thickness of the first and second links L1 and L2 and a weight that is lighter than the weight of the first and second links L1 and L2, but is not limited thereto.

The fourth link L4 may be connected to the third link L3.

Specifically, the fourth link L4 may connect the third link L3 and the fifth link L5 to each other. That is, one end of the fourth link L4 may be fixed to the other end of the third link L3, and the other end thereof may be fixed to one end of the fifth link L5. As described above, since ends of the fourth link L4 are fixed to the third link L3 and the fifth link L5, respectively, the fifth link L5 may operate in the same manner as the third link L3. Further, since the fourth link L4 is not a main link that supports the load of the transported material, but is a sub-link that constitutes the four-bar link in the same manner as the third link L3, the fourth link L4 may have a thickness that is thinner than the thickness of the first and second links L1 and L2 and a weight that is lighter than the weight of the first and second links L1 and L2, but is not limited thereto.

The other end of the fifth link L5 may be connected to the other end of the second link L2, and may be provided on the upper portion of the second link L2.

Specifically, the fifth link L5 may connect the second link L2 and the fourth link L4 to each other. That is, one end of the fifth link L5 may be connected to the other end of the fourth link L4, and the other end of the fifth link L5 may be connected to the other end of the second link L2.

Further, since the fifth link L5 is not a main link that supports the load of the transported material, but is a sub-link that constitutes the four-bar link in the same manner as the third and fourth links L3 and L4, the fifth link L5 may have a thickness that is thinner than the thickness of the first and second links L1 and L2 and a weight that is lighter than the weight of the first and second links L1 and L2, but is not limited thereto.

In addition, the fifth link L5 may serve to transport a glass substrate that is a transported material or a mask that is formed of a heavy material, and the link structure 1 can determine the position and direction of the transported material by operating the fifth link L5.

FIGS. 4 and 5 illustrate how the forward and backward motion of the link structure 1 of FIG. 1 is performed.

The fifth link L5 can perform the forward or backward motion when the second and third links L2 and L3 are rotated in an opposite direction to the direction of the first link L1.

Specifically, for example, if the second link L2 is rotated in a clockwise direction CD and the first and third links L1 and L3 are rotated in a counterclockwise direction CCD, the fifth link L5 may perform the forward motion. Further, if the second link L2 is rotated in a counterclockwise direction CCD and the first and third links L1 and L3 are rotated in a clockwise direction CD, the fifth link L5 may perform the backward motion.

FIGS. 4 and 5 illustrate that the fifth link L5 performs the forward motion when the second link L2 is rotated in the clockwise direction CD and the first and third links L1 and L3 are rotated in the counterclockwise direction CCD.

In addition, if the angular velocity of the second link L2 is greater than the angular velocity of the first link L1, the forward or backward motion of the fifth link L5 may be performed. For example, if the second link L2 is rotated at twice the angular velocity of the first link L1, the forward or backward motion of the fifth link L5 may be performed, but is not limited thereto.

FIGS. 6 and 7 illustrate how the left and right motion of the link structure 1 of FIG. 1 is performed.

The fifth link L5 can perform the left or right motion when the first and second links L1 and L2 are rotated in an opposite direction to the direction of the third link L3.

Specifically, for example, if the first and second links L1 and L2 are rotated in a counterclockwise direction CCD and the third link L3 is rotated in a clockwise direction CD, the fifth link L5 may move to the left. Further, if the first and second links L1 and L2 are rotated in the clockwise direction CD and the third link L3 is rotated in the counterclockwise direction CCD, the fifth link L5 may be move to the right.

FIGS. 6 and 7 illustrate that the fifth link L5 moves to the left when the first and second links L1 and L2 are rotated in the counterclockwise direction CCD and the third link L3 is rotated in the clockwise direction CD.

In addition, if the amount of forward or backward motion of an end portion of the first link L1 when the first link L1 is rotated is equal to the amount of forward or backward motion of the second link L2 when the second link L2 is rotated, the fifth link L5 can perform the left or right motion without performing the forward or backward motion of the link structure 1. It is understood, however, that the exemplary embodiments are not limited to such a configuration.

According to an exemplary embodiment, the term "equal to" may refer to not only "completely equal to" but also "including a difference within an error range" (e.g., substantially similar to within an error range).

Since the link structure 1 according to an exemplary embodiment includes an actuator that is a drive source in a start portion of the link structure 1, e.g., the first link L1, rather than an end portion of the link structure 1, the moment of inertia can be decreased, and the link structure 1 itself can be lightweight. Further, since an actuator or a power transfer component is not provided in a sub-link of the link structure 1, the sub-link can be exposed in a vacuum environment. Accordingly, the use rate of the magnetic fluid seal for sealing of the link structure 1 can be lowered, and thus a risk of leakage and the manufacturing cost can also be lowered.

Further, according to another aspect, by providing respective actuators outside the first link L1 and connecting respective rotary shafts to the actuators through pulleys, all links can be maintained in a vacuum state and the use of the magnetic fluid seal can be further reduced. This feature can be applied to link structures 2, 3, and 4 to be described later in the same manner.

Hereinafter, referring to FIGS. 8 to 13, a link structure according to another exemplary embodiment will be described. Here, an explanation will be provided which focuses on differences between this exemplary embodiment and the previously described exemplary embodiment.

Figure 8:
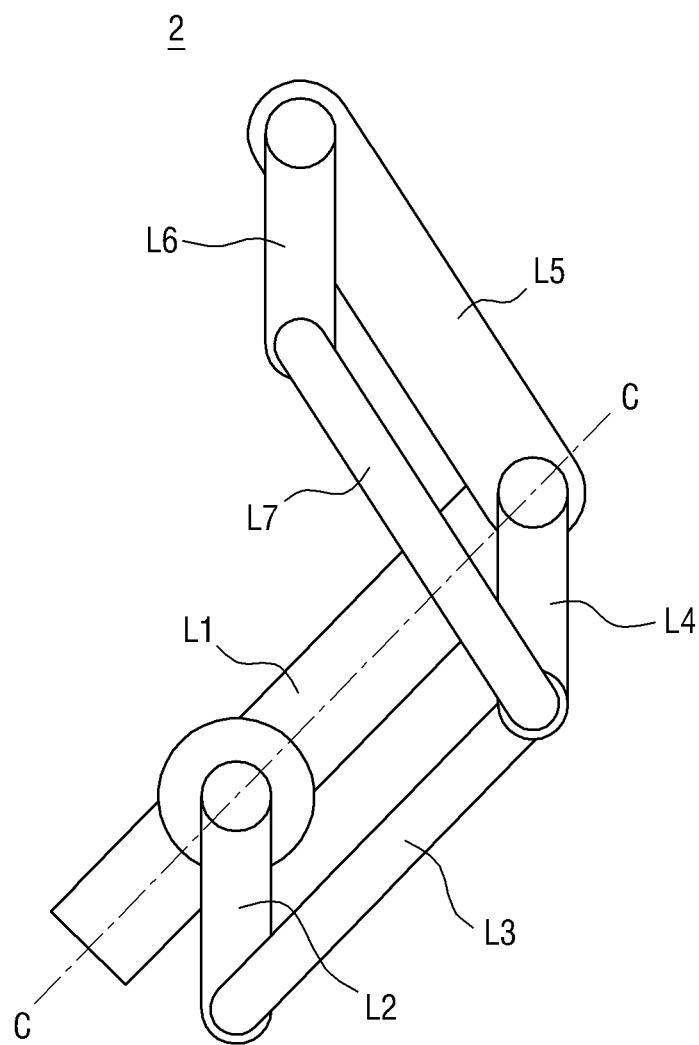
FIG. 8 is a conceptual view explaining a link structure according to another exemplary embodiment.
Figure 9:
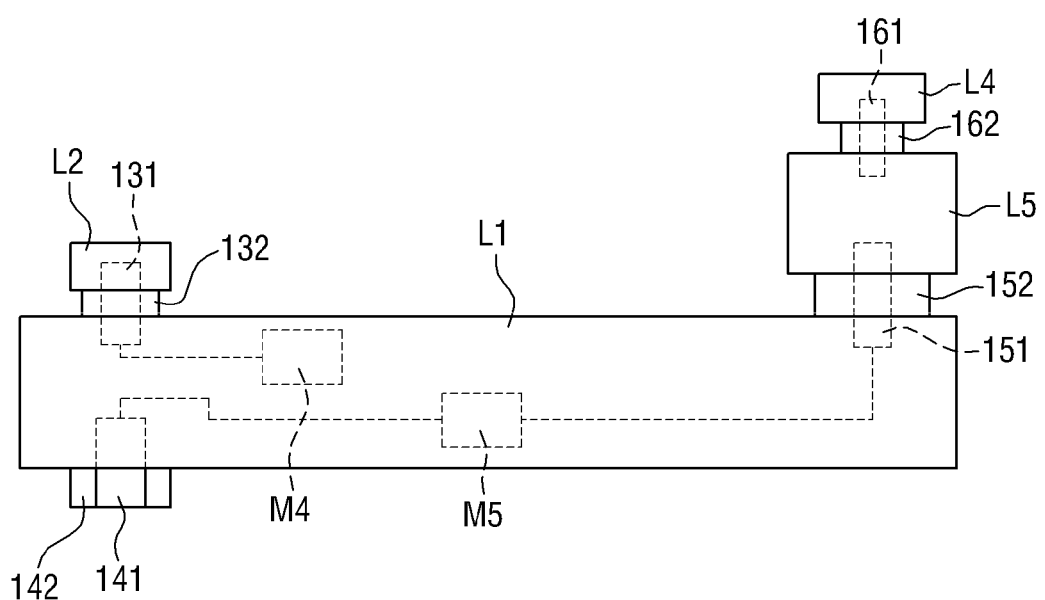
FIG. 9 is a cross-sectional view cut along line C-C of FIG. 8.
Figure 10:
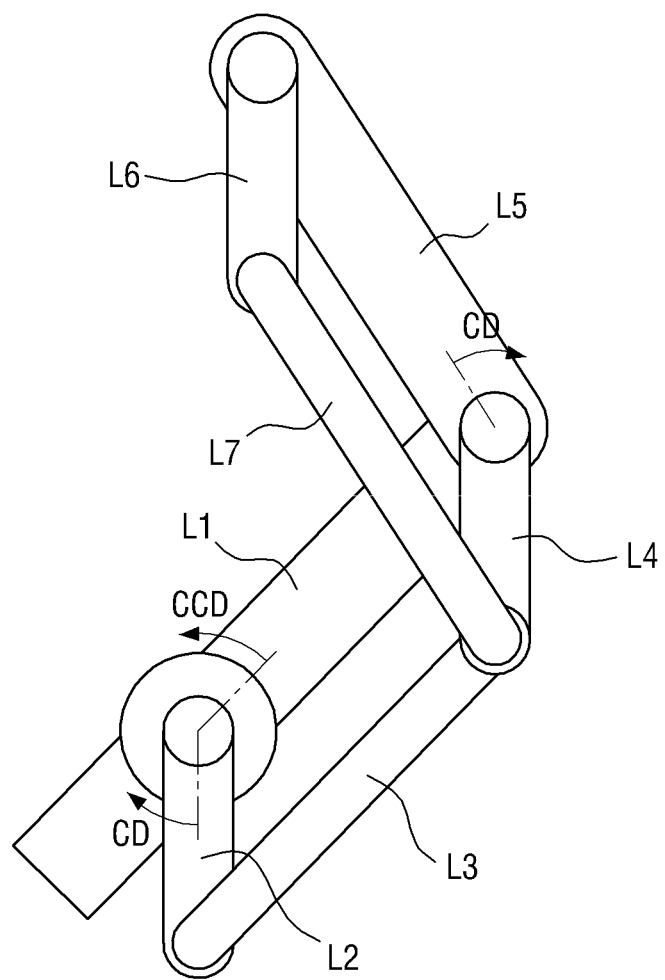
FIGS. 10 and 11 are views explaining an example of the operation of the link structure of FIG. 8.
Figure 11:
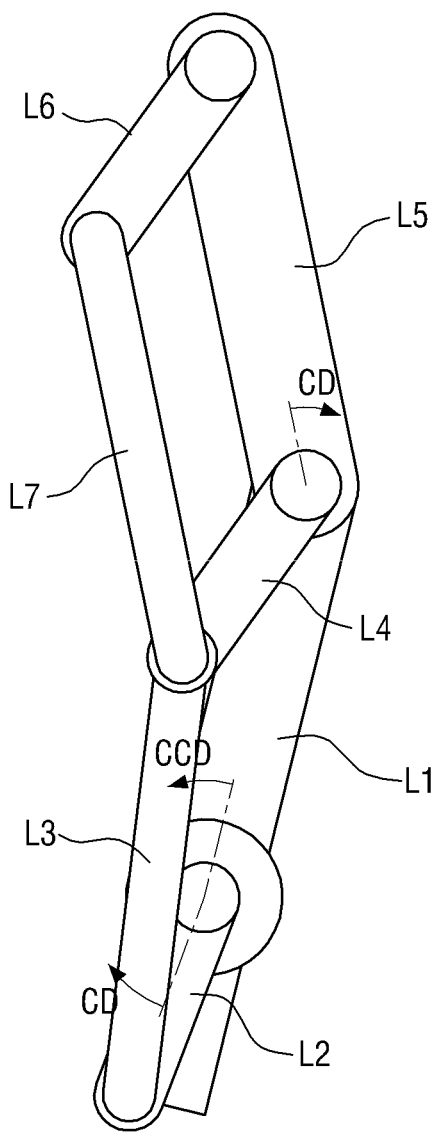
Figure 12:
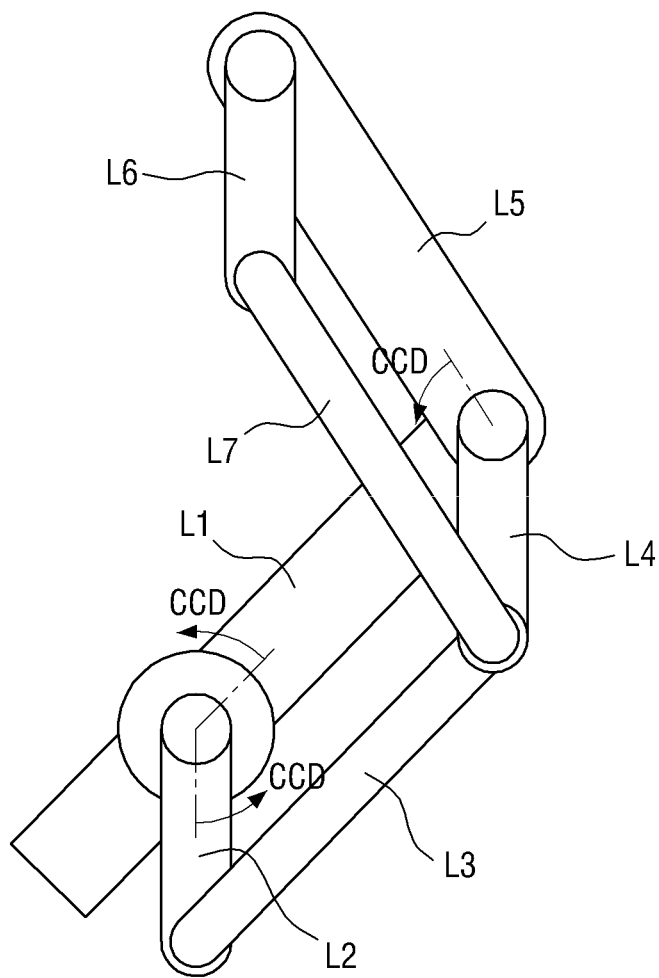
FIGS. 12 and 13 are views explaining another example of the operation of the link structure of FIG. 8.
Figure 13:
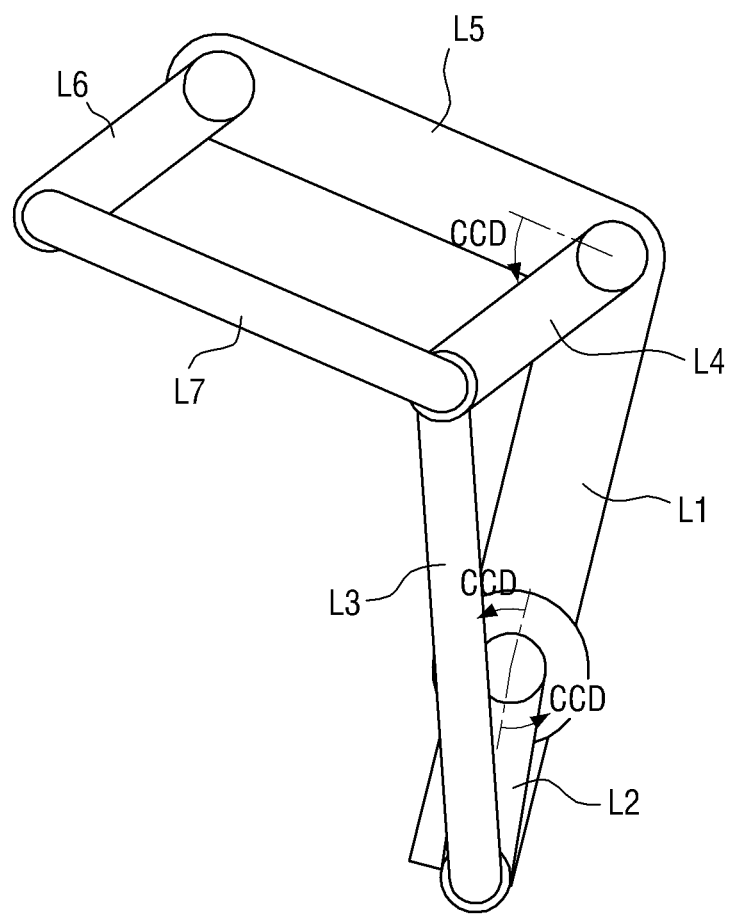

FIG. 8 is a conceptual view explaining a link structure according to another exemplary embodiment, and FIG. 9 is a cross-sectional view cut along line C-C of FIG. 8. FIGS. 10 and 11 are views explaining an example of the operation of the link structure of FIG. 8, and FIGS. 12 and 13 are views explaining an example of the operation of the link structure of FIG. 8.

First, referring to FIG. 8, a link structure 2 according to another exemplary embodiment may include first to seventh links L1, L2, L3, L4, L5, L6 and L7.

The first link L1 may include fourth and fifth actuators M4 and M5 (in FIG. 9) and may be operated by the fifth actuator M5. Further, one end of the first link L1 may be connected to one end of the fifth link L5, and the first link L1 and the fifth link L5 may be main links that support the load of a transported material.

Since the first link L1 includes the actuators M4 and M5 (in FIG. 9), the interior of the first link L1 should be kept in an atmospheric state. Accordingly, the interior of the first link L1 may be kept in the atmospheric state, and in order to maintain the atmospheric state, a magnetic fluid seal may be used. This feature will be described in detail later.

In addition, since the first link L1 includes the actuators M4 and M5 (in FIG. 9) therein, the first link L1 may be thicker than the other links L2, L3, L4, L5, L6 and L7, but is not limited thereto.

Referring to FIG. 9, the fourth actuator M4 may be positioned in the first link L1 and may be connected to a fourth rotary shaft 131. Further, the fourth actuator M4 may drive, e.g., rotate the second link L2 through rotation of the fourth rotary shaft 131.

Further, the fourth rotary shaft 131 may connect the first link L1 and the second link L2 to each other. One end of the fourth rotary shaft 131 may be positioned in the first link L1, and the other end thereof may be positioned in the second link L2. Further, a part of the fourth rotary shaft 131 that is positioned between the first link L1 and the second link L2 may be surrounded and sealed by a fourth cover 132.

A magnetic fluid seal may be positioned between the fourth cover 132 and the fourth rotary shaft 131, but is not limited thereto.

Further, the fifth actuator M5 may be positioned in the first link L1, and may be connected to the fifth rotary shaft 141 and the sixth rotary shaft 151. Further, the fifth actuator M5 may drive, e.g., rotate, the first link L1 and the fifth link L5 through rotation of the fifth rotary shaft 141 and the sixth rotary shaft 151. The first link L1 and the fifth link L5 may interlock with one actuator, e.g., the fifth actuator M5, to operate, respectively. This feature will be described in detail later.

A part of the fifth rotary shaft 141 may be positioned in the first link L1, and the remaining part thereof may be positioned outside the first link L1. Further, the fifth rotary shaft 141 that projects to an outside may be surrounded by a fifth cover 142, and the magnetic fluid seal may be positioned between the fifth rotary shaft 141 and the fifth cover 142, but is not limited thereto. Further, the fifth rotary shaft 141 may be driven by the fifth actuator M5 to rotate the first link L1.

A sixth rotary shaft 151 may connect the first link L1 and the fifth link L5 to each other. One end of the sixth rotary shaft 151 may be positioned in the first link L1, and the other end thereof may be positioned in the fifth link L5. Further, a part of the sixth rotary shaft 151 that is positioned between the first link L1 and the fifth link L5 may be surrounded and sealed by a sixth cover 152.

Further, the magnetic fluid seal may be positioned between the sixth cover 152 and the sixth rotary shaft 151, but is not limited thereto.

A seventh rotary shaft 161 may connect the fifth link L5 and the fourth link L4 to each other. One end of the seventh rotary shaft 161 may be positioned in the fifth link L5, and the other end thereof may be positioned in the fourth link L4. Further, a part of the seventh rotary shaft 161 that is positioned between the fifth link L5 and the fourth link L4 may be surrounded and sealed by a seventh cover 162.

Referring again to FIG. 8, one end of the second link L2 may be connected to the other end of the first link L1 and may be operated by the fourth actuator M4.

Specifically, one end of the second link L2 may be connected to the other end of the first link L1, and the other end of the second link L2 may be connected to one end of the third link L3. As described above, the second link L2 may constitute the four-bar link through a connection between the first link L1 and the third link L3.

Further, since the second link L2 is not a main link that supports the load of the transported material, but is a sub-link that constitutes the four-bar link, the second link L2 may have a thickness that is thinner than the thickness of the first and fifth links L1 and L5 and a weight that is lighter than the weight of the first and fifth links L1 and L5, but is not limited thereto.

The third link L3 may be connected to the second link L2.

Specifically, one end of the third link L3 may be connected to the other end of the second link L2, and the other end thereof may be connected to one end of the fourth link L4. Further, the third link L3 may be provided on the upper portion of the fourth link L4. As described above, the third link L3 may be connected between the second link L2 and the fourth link L4 to constitute the four-bar link.

One end of the third link L3 may be fixed to the other end of the second link L2, and the other end of the third link L3 may be fixed to one end of the fourth link L4.

Further, since the third link L3 is not a main link that supports the load of the transported material, but is a sub-link that constitutes the four-bar link, the third link L3 may have a thickness that is thinner than the thickness of the first and fifth links L1 and L5 and a weight that is lighter than the weight of the first and fifth links L1 and L5, but is not limited thereto.

In addition, the other end of the third link L3 may be connected to one end of the seven link L7, and thus the link structure 2 may include a structure in which four-bar links are piled one on another. This feature will be described in detail later.

The fourth link L4 may be connected to the third link L3.

Specifically, the fourth link L4 may connect the third link L3 and the fifth link L5 to each other. That is, one end of the fourth link L4 may be connected to the other end of the third link L3, and the other end thereof may be connected to one end of the fifth link L5. In addition, the fourth link L4 may be provided on the upper portion of the fifth link L5.

Similar to the third link L3, since the fourth link L4 is not a main link that supports the load of the transported material, but is a sub-link that constitutes the four-bar link, the fourth link L4 may have a thickness that is thinner than the thickness of the first and fifth links L1 and L5 and a weight that is lighter than the weight of the first and fifth links L1 and L5, but is not limited thereto.

In addition, one end of the fourth link L4 may be connected to one end of the seventh link L7, and thus the link structure 2 may include a structure in which four-bar links are piled one on another. Further, the fourth link L4 is a link that is included in both the four-bar link that includes the first to fourth links L1 to L4 and the four-bar link that includes the fourth to seventh links L4 to L7, and may serve as an auxiliary component that is shared by the respective four-bar link structures.

The fifth link L5 may be connected to the first link L1, and may be operated by the fifth actuator M5. As described above, the first link L1 and the fifth link L5 may be main links that support the load of the transported material.

Specifically, one end of the fifth link L5 may be connected to one end of the first link L1, and the fifth link L5 may serve as a main link that supports the load of the transported material. Further, one end of the fifth link L5 may be connected to the other end of the fourth link L4, and the other end of the fifth link L5 may be connected to one end of the sixth link L6. That is, the fifth link L5 may constitute the four-bar link together with the fourth, sixth, and seventh links L4, L6, and L7.

The sixth link L6 may be connected to the fifth link L5.

Specifically, the sixth link L6 may connect the fifth link L5 and the seventh link L7 to each other. That is, one end of the sixth link L6 may be connected to the other end of the fifth link L5, and the other end thereof may be connected to the other end of the seventh link L7.

Further, like the fourth and seventh links L4 and L7, since the sixth link L6 is a sub-link that constitutes the four-bar link, the sixth link L6 may have a thickness that is thinner than the thickness of the first and fifth links L1 and L5 and a weight that is lighter than the weight of the first and fifth links L1 and L5, but is not limited thereto.

The seventh link L7 may connect the fourth link L4 and the sixth link L6 to each other.

Specifically, one end of the seventh link L7 may be connected to the other end of the third link L3, and the other end of the seventh link L7 may be connected to the other end of the sixth link L6.

One end of the seventh link L7 may be fixed to the other end of the third link L3, and the other end thereof may be fixed to the other end of the sixth link L6.

Accordingly, the fourth link L4 is operated by an operation of the second link L2, and the sixth link L6 may be operated by an operation of the fourth link L4.

Further, like the fourth and sixth links L4 and L6, since the seventh link L7 is a sub-link that constitutes the four-bar link, the seventh link L7 may have a thickness that is thinner than the thickness of the first and fifth links L1 and L5 and a weight that is lighter than the weight of the first and fifth links L1 and L5, but is not limited thereto.

FIGS. 10 and 11 illustrate how the forward and backward motion of the link structure 2 of FIG. 2 is performed.

The sixth link L6 can perform the forward or backward motion when the second and fifth links L2 and L5 are rotated in an opposite direction to the direction of the first link L1.

Specifically, for example, if the second and fifth links L2 and L5 are rotated in a clockwise direction CD and the first link L1 is rotated in a counterclockwise direction CCD, the sixth link L6 may perform the forward motion. Further, if the second and fifth links L2 and L5 are rotated in the counterclockwise direction CCD and the first link L1 is rotated in the clockwise direction CD, the sixth link L6 may perform the backward motion.

FIGS. 10 and 11 illustrate that sixth link L6 performs the forward motion when the second and fifth links L2 and L5 are rotated in the clockwise direction CD and the first link L1 is rotated in the counterclockwise direction CCD.

In addition, if the angular velocity of the second and fifth links L2 and L5 is greater than the angular velocity of the first link L1, the forward or backward motion of the sixth link L6 may be performed. For example, if the second and fifth links L2 and L5 are rotated at twice the angular velocity of the first link L1, the forward or backward motion of the sixth link L6 may be performed, but exemplary embodiments not limited thereto.

FIGS. 12 and 13 illustrate how left or right motion of the link structure 2 of FIG. 8 is performed.

The sixth link L6 can perform the left or right motion when the first and fifth links L1 and L5 are rotated in an opposite direction to the direction of the second link L2.

Specifically, for example, if the first, second, and fifth links L1, L2, and L5 are rotated in the counterclockwise direction CCD, the sixth link L6 may move to the left. Further, if the first, second, and fifth links L1, L2, and L5 are rotated in the clockwise direction CD, the sixth link L6 may be move to the right.

FIGS. 12 and 13 illustrate that the sixth link L6 moves to the left when the first, second, and fifth links L1, L2, and L5 are rotated in the counterclockwise direction CCD.

In addition, if the amount of forward or backward motion of the end portion of the first link L1 when the first link L1 is rotated is equal to the amount of forward or backward motion of the fifth link L5 when the fifth link L5 is rotated, the sixth link L6 can perform the left or right motion without performing the forward or backward motion of the link structure 2, although exemplary embodiments not limited to such a configuration.

According to an exemplary embodiment, the term "equal to" may refer to not only "completely equal to" but also "including a difference within an error range".

Hereinafter, referring to FIGS. 14 to 20, a link structure according to still another exemplary embodiment will be described. An explanation will be focused on differences between this exemplary embodiment and the previously described exemplary embodiments.

Figure 14:
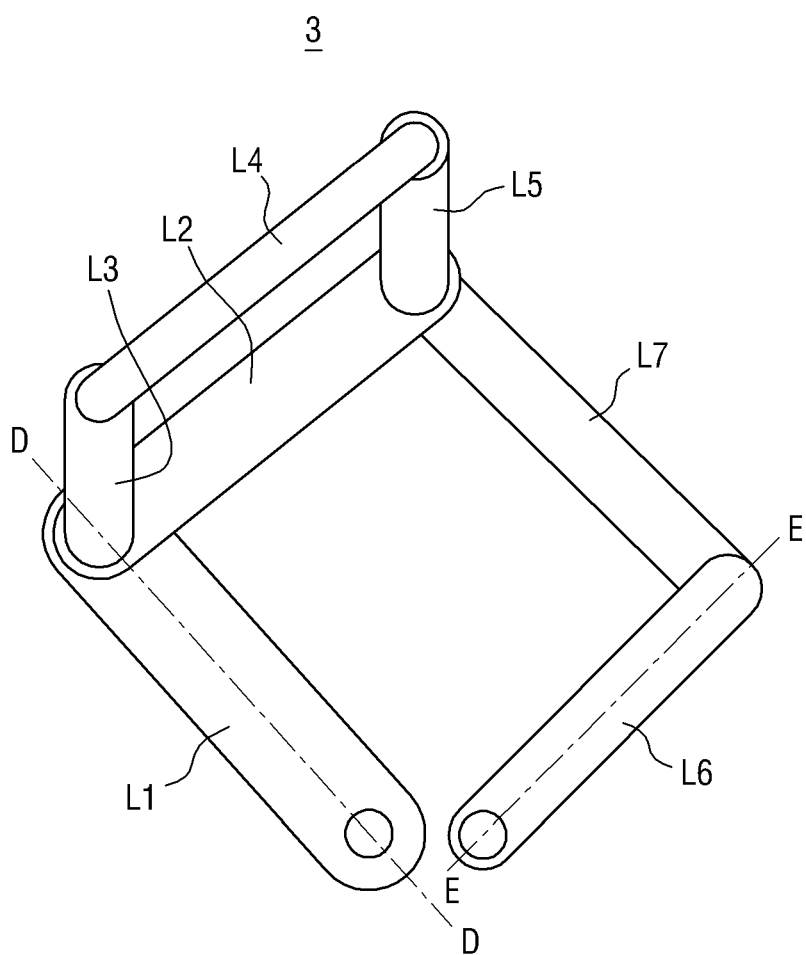
FIG. 14 is a conceptual view explaining a link structure according to still another exemplary embodiment.
Figure 15:
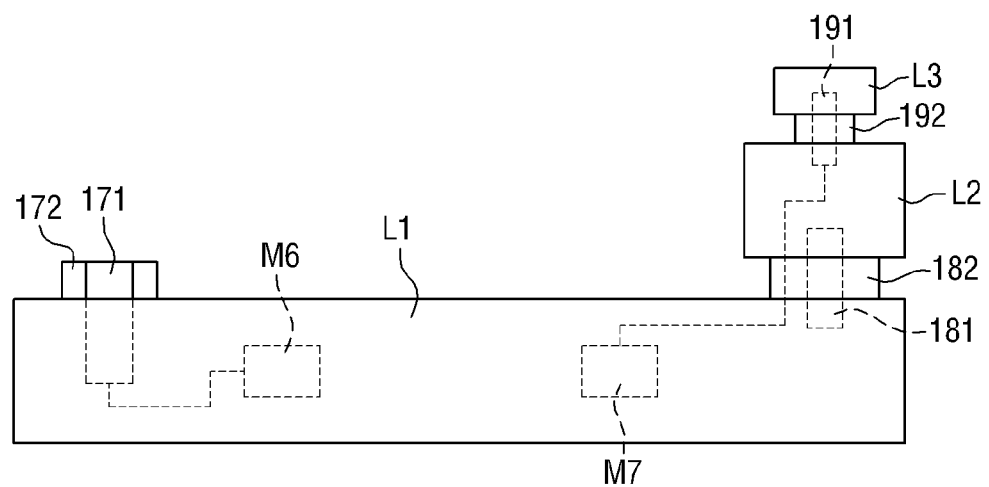
FIG. 15 is a cross-sectional view cut along line D-D of FIG. 14.
Figure 16:
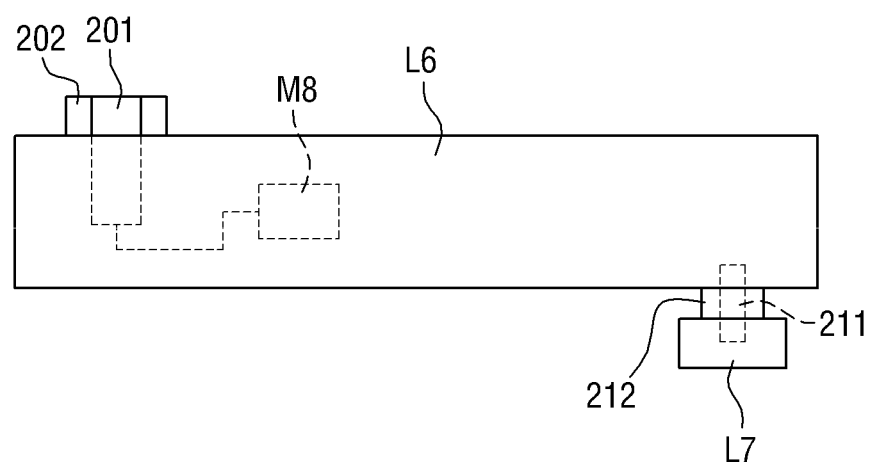
FIG. 16 is a cross-sectional view cut along line E-E of FIG. 14.
Figure 17:
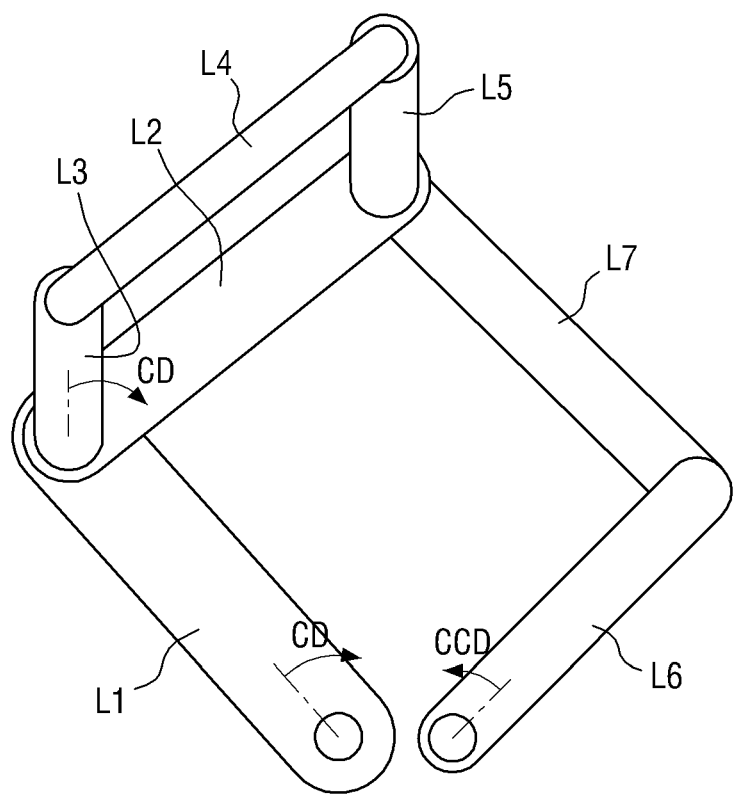
FIGS. 17 and 18 are views explaining an example of the operation of the link structure of FIG. 14.
Figure 18:
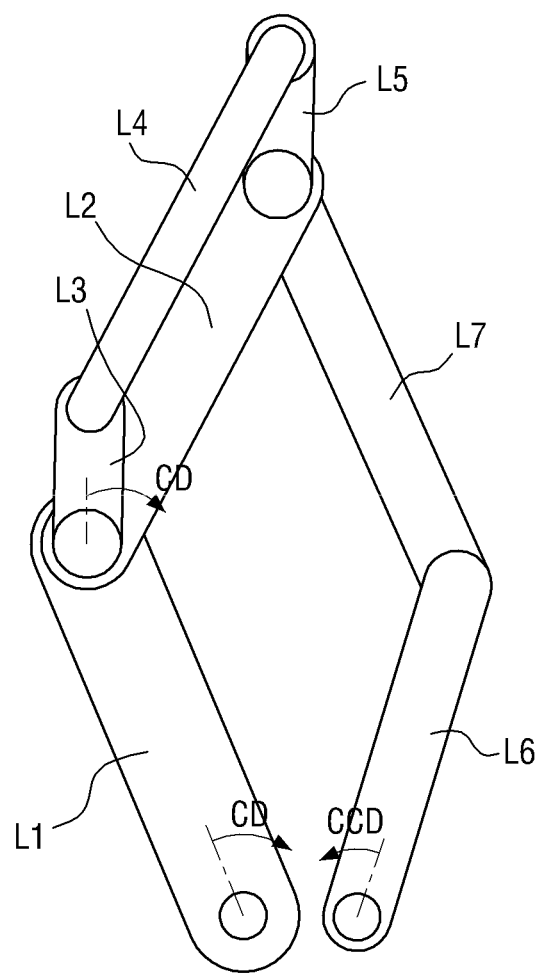
Figure 19:
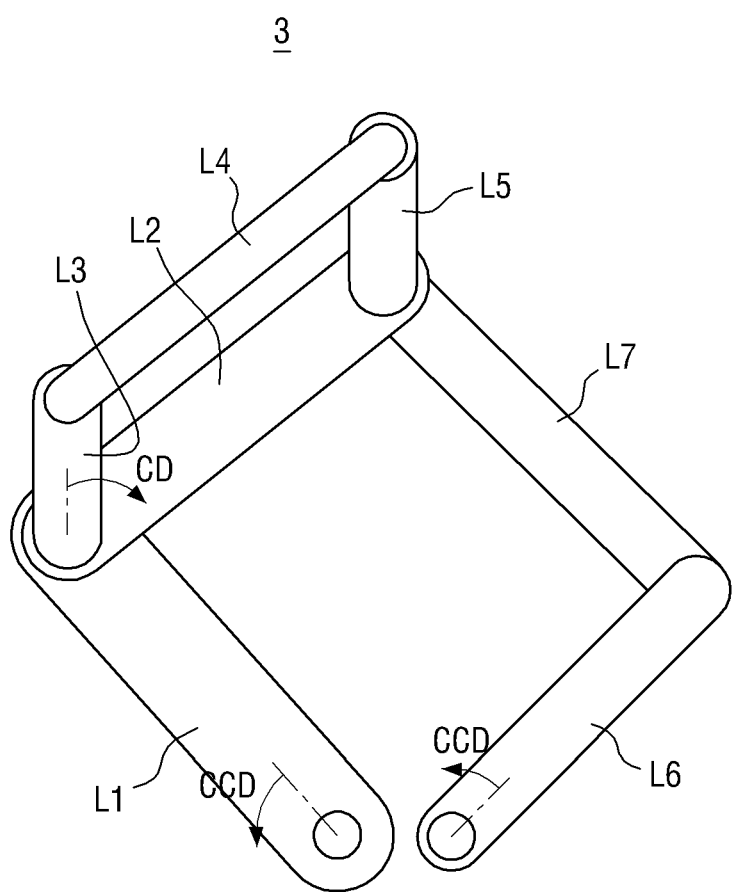
FIGS. 19 and 20 are views explaining another example of the operation of the link structure of FIG. 14.
Figure 20:
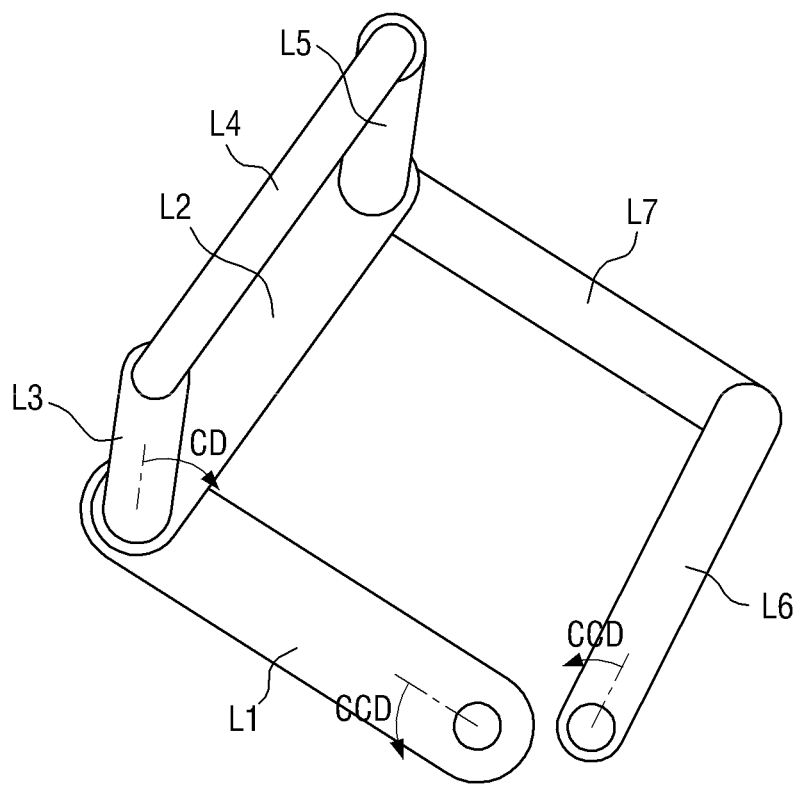

FIG. 14 is a conceptual view explaining a link structure according to still another exemplary embodiment. FIG. 15 is a cross-sectional view cut along line D-D of FIG. 14, and FIG. 16 is a cross-sectional view cut along line E-E of FIG. 14. FIGS. 17 and 18 are views explaining an example of the operation of the link structure of FIG. 14, and FIGS. 19 and 20 are views explaining another example of the operation of the link structure of FIG. 14.

First, referring to FIG. 14, a link structure 3 according to still another exemplary embodiment may include first to seventh links L1, L2, L3, L4, L5, L6 and L7.

The first link L1 may include sixth and seventh actuators M6 and M7 (in FIG. 15) and may be operated by the sixth actuator M6. Further, one end of the first link L1 may be connected to one end of the second link L2.

Since the first link L1 includes the actuators M6 and M7 (in FIG. 15), the interior of the first link L1 should be kept in an atmospheric state. Accordingly, the interior of the first link L1 may be kept in the atmospheric state, and in order to maintain the atmospheric state, a magnetic fluid seal may be used. This feature will be described in detail later.

In addition, since the first link L1 includes the actuators M6 and M7 (in FIG. 15) therein, the first link L1 may be thicker than other links, but is not limited thereto.

Referring to FIG. 15, the sixth actuator M6 may be positioned in the first link L1 and may be connected to an eighth rotary shaft 171. Further, the sixth actuator M6 may drive, e.g., rotate the first link L1 through rotation of the eighth rotary shaft 171.

A part of the eighth rotary shaft 171 may be positioned in the first link L1, and the remaining part thereof may be positioned outside the first link L1. Further, the eighth rotary shaft 171 that projects to an outside may be surrounded by an eighth cover 172. A magnetic fluid seal may be positioned between the eighth rotary shaft 171 and the eighth cover 172, but is not limited thereto.

The seventh actuator M7 may be positioned in the first link L1 and may be connected to a tenth rotary shaft 191. Further, the seventh actuator M7 may drive, e.g., rotate the third link L3 through rotation of the tenth rotary shaft 191.

The tenth rotary shaft 191 may connect the second link L2 and the third link L3 to each other. One end of the tenth rotary shaft 191 may be positioned in the second link L2, and the other end thereof may be positioned in the third link L3. Further, a part of the tenth rotary shaft 191 that is positioned between the second link L2 and the third link L3 may be surrounded and sealed by a tenth cover 192.

The ninth rotary shaft 181 may connect the first link L1 and the second link L2 to each other. One end of the ninth rotary shaft 181 may be positioned in the first link L1, and the other end thereof may be positioned in the second link L2. Further, a part of the ninth rotary shaft 181 that is positioned between the first link L1 and the second link L2 may be surrounded and sealed by a ninth cover 182. In addition, a magnetic fluid seal may be positioned between a part of the ninth rotary shaft 181 and the ninth cover 182, but is not limited thereto.

Referring again to FIG. 14, the second link L2 may be connected to the first link L1.

Specifically, one end of the second link L2 may be connected to one end of the first link L1, and the other end of the second link L2 may be connected to one end of the seventh link L7. The second link L2 may be provided on upper portions of the first and seventh links L1 and L7.

Further, since one end of the second link L2 may be connected to one end of the third link L3 and the other end of the second link L2 may be connected to one end of the fifth link L5, the second link L2 may be one element of a four-bar link that includes the second to fifth links L2 to L5.

One end of the third link L3 may be connected to one end of the first link L1 and may be operated by the seventh actuator M7.

Specifically, the third link L3 may be provided on the upper portion of the second link L2. Further, one end of the third link L3 may be connected to one end of the second link L2, and the other end thereof may be connected to one end of the fourth link L4. As described above, the third link L3 may be connected between the second link L2 and the fourth link L4 to constitute the four-bar link.

The fourth link L4 may be connected to the third link L3.

Specifically, the fourth link L4 may connect the third link L3 and the fifth link L5 to each other. That is, one end of the fourth link L4 may be connected to the other end of the third link L3, and the other end thereof may be connected to the other end of the fifth link L5.

The fifth link L5 may be connected to the fourth link L4.

Specifically, the fifth link L5 may connect the fourth link L4 and the second link L2 to each other. That is, one end of the fifth link L5 may be connected to the other end of the second link L2, and the other end thereof may be connected to the other end of the fourth link L4.

As described above, the second to fifth links L2 to L5 may be connected to constitute a four-bar link structure.

The sixth link L6 may include an eighth actuator M8 (in FIG. 16) and may be operated by the eighth actuator M8. Further, one end of the sixth link L6 may be connected to the other end of the seventh link L7.

Since the sixth link L6 includes the actuator M8 (in FIG. 16), the interior of the sixth link L6 should be kept in an atmospheric state. Accordingly, the interior of the sixth link L6 may be kept in an atmospheric state, and a magnetic fluid seal may be used to keep such an atmospheric state. This feature will be described in detail later.

In addition, since the sixth link L6 includes the actuator M8 (in FIG. 16) therein, the sixth link L6 may have a thickness that is thicker than the thickness of other links, but is not limited thereto.

Referring to FIG. 16, the eighth actuator M8 may be positioned in the sixth link L6 and may be connected to an eleventh rotary shaft 201. Further, the eighth actuator M8 may drive, e.g., rotate the sixth link L6 through rotation of the eleventh rotary shaft 201.

A part of the eleventh rotary shaft 201 may be positioned in the sixth link L6, and the remaining part thereof may be positioned outside the sixth link L6. The eleventh rotary shaft 201 that projects to an outside may be surrounded by an eleventh cover 202. Further, a magnetic fluid seal may be positioned between the eleventh rotary shaft 201 and the eleventh cover 202, but is not limited thereto.

A twelfth rotary shaft 211 may connect the sixth link L6 and the seventh link L7 to each other. One end of the twelfth rotary shaft 211 may be positioned in the sixth link L6, and the other end thereof may be positioned in the seventh link L7. Further, a part of the twelfth rotary shaft 211 that is positioned between the sixth link L6 and the seventh link L7 may be surrounded and sealed by a twelfth cover 212.

In addition, a magnetic fluid seal may be positioned between the twelfth cover 212 and the twelfth rotary shaft 211, but is not limited thereto.

Referring again to FIG. 14, the seventh link L7 may be connected to the sixth link L6.

Specifically, the seventh link L7 may connect the second link L2 and the sixth link L6 to each other. That is, one end of the seventh link L7 may be connected to the other end of the second link L2, and the other end thereof may be connected to one end of the sixth link L6.

Unlike the link structures 1 and 2 as described above, the link structure 3 includes a four-bar link that includes the second to fifth links L2 to L5 and a two-bar link that includes the sixth and seventh links L6 and L7, and thus can have a parallel type five-bar link structure.

FIGS. 17 and 18 illustrate how forward and backward motion of the link structure 3 of FIG. 14 is performed.

The fifth link L5 can perform forward or backward motion when the first and third links L1 and L3 are rotated in an opposite direction to the direction of the sixth link L6.

Specifically, for example, if the first and third links L1 and L3 are rotated in a clockwise direction CD and the sixth link L6 is rotated in a counterclockwise direction CCD, the fifth link L5 may perform the forward motion. Further, if the first and third links L1 and L3 are rotated in the counterclockwise direction CCD and the sixth link L6 is rotated in the clockwise direction CD, the fifth link L5 may perform the backward motion.

FIGS. 17 and 18 illustrate that the fifth link L5 performs the forward motion when the first and third links L1 and L3 are rotated in the clockwise direction CD and the sixth link L6 is rotated in the counterclockwise direction CCD.

In addition, if the first and sixth links L1 and L6 have the same angular velocity, the forward or backward motion of the fifth link L5 may be performed, but exemplary embodiments are not limited thereto.

FIGS. 19 and 20 illustrate how left or right motion of the link structure 3 of FIG. 14 is performed.

The fifth link L5 can perform the left or right motion when the first and sixth links L1 and L6 are rotated in an opposite direction to the direction of the third link L3.

Specifically, for example, if the first and sixth links L1 and L6 are rotated in the counterclockwise direction CCD and the third link L3 is rotated in the clockwise direction CD, the fifth link L5 may move to the left. Further, if the first and sixth links L1 and L6 are rotated in the clockwise direction CD and the third link L3 is rotated in the counterclockwise direction CCD, the fifth link L5 may be move to the right.

FIGS. 19 and 20 illustrate that the fifth link L5 moves to the left when the first and sixth links L1 and L6 are rotated in the counterclockwise direction CCD and the third link L3 is rotated in the clockwise direction CD.

In addition, if the amount of forward or backward motion of the end portion of the first link L1 when the first link L1 is rotated is equal to the amount of forward or backward motion of the sixth link L6 when the sixth link L6 is rotated, the fifth link L5 can perform the left or right motion without performing the forward or backward motion of the link structure 3, but exemplary embodiments are not limited thereto.

According to an exemplary embodiment, the term "equal to" may refer to not only "completely equal to" but also "including a difference within an error range".

Since the link structure 3 according to still another exemplary embodiment includes an actuator that is a drive source in a start portion, e.g., the first link L1 and the sixth link L6, rather than an end portion, the moment of inertia can be decreased. Further, since the load of the transported material is dispersed to the plurality of links, the link structure 3 can be lightweight. In addition, since an actuator or a power transfer component is not provided in the remaining links except for the first and sixth links L1 and L6 of the link structure 3, the number of links which require sealing can be reduced, and thus the number of magnetic fluid seals can also be reduced. Accordingly, risks of atmospheric leakage and the manufacturing cost can be lowered.

Hereinafter, referring to FIGS. 21 to 27, a link structure according to yet still another exemplary embodiment will be described. Explanation will be focused on differences between this exemplary embodiment and the previously described exemplary embodiments.

Figure 21:
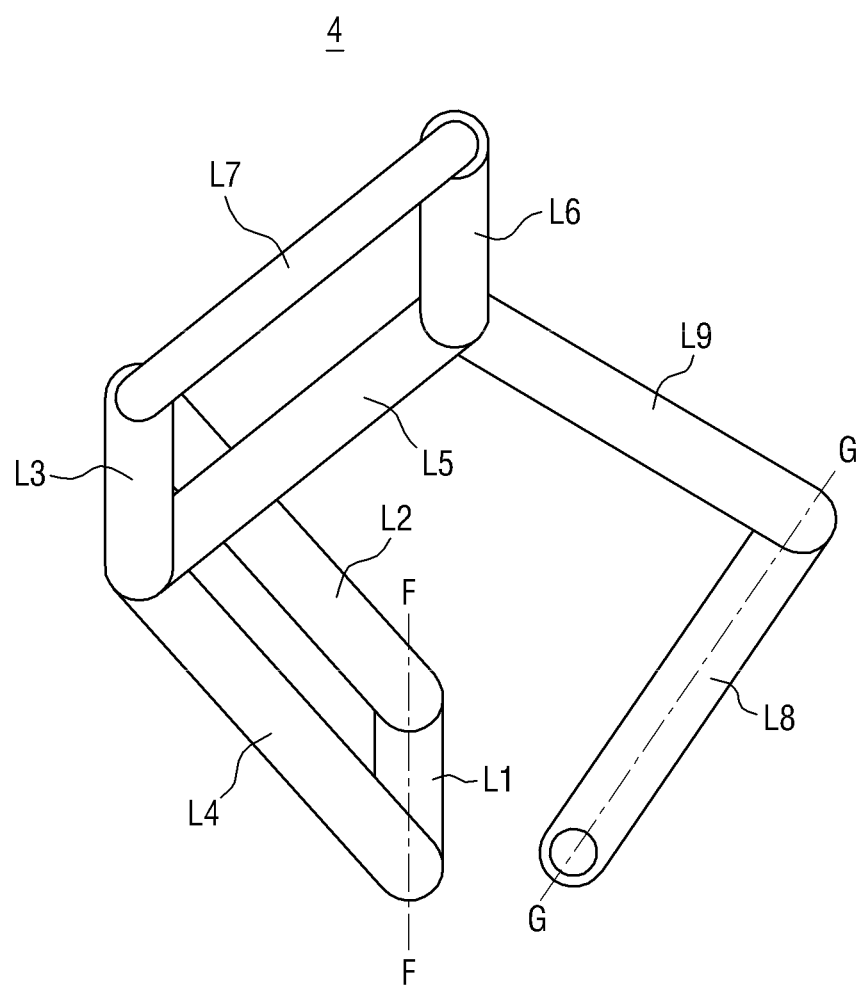
FIG. 21 is a conceptual view explaining a link structure according to yet still another exemplary embodiment.
Figure 22:
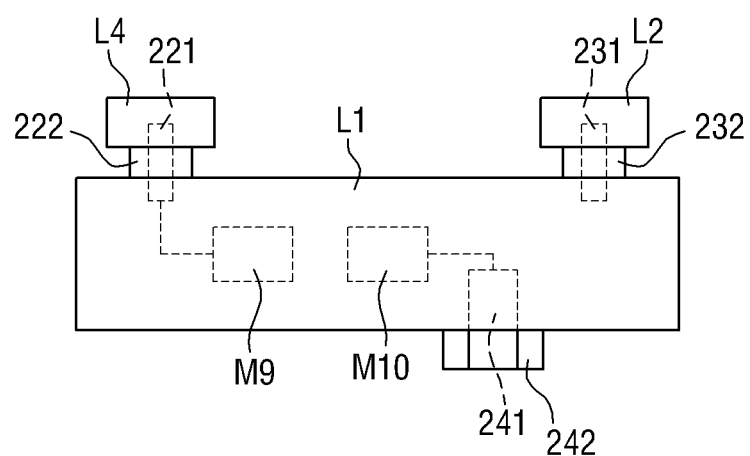
FIG. 22 is a cross-sectional view cut along line F-F of FIG. 21.
Figure 23:
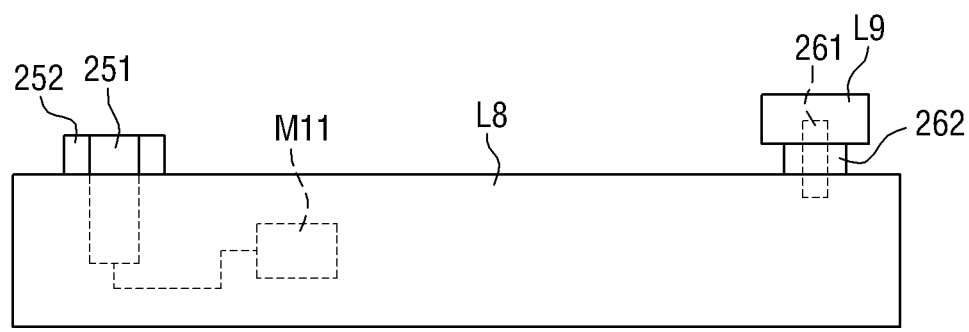
FIG. 23 is a cross-sectional view cut along line G-G of FIG. 21.
Figure 24:
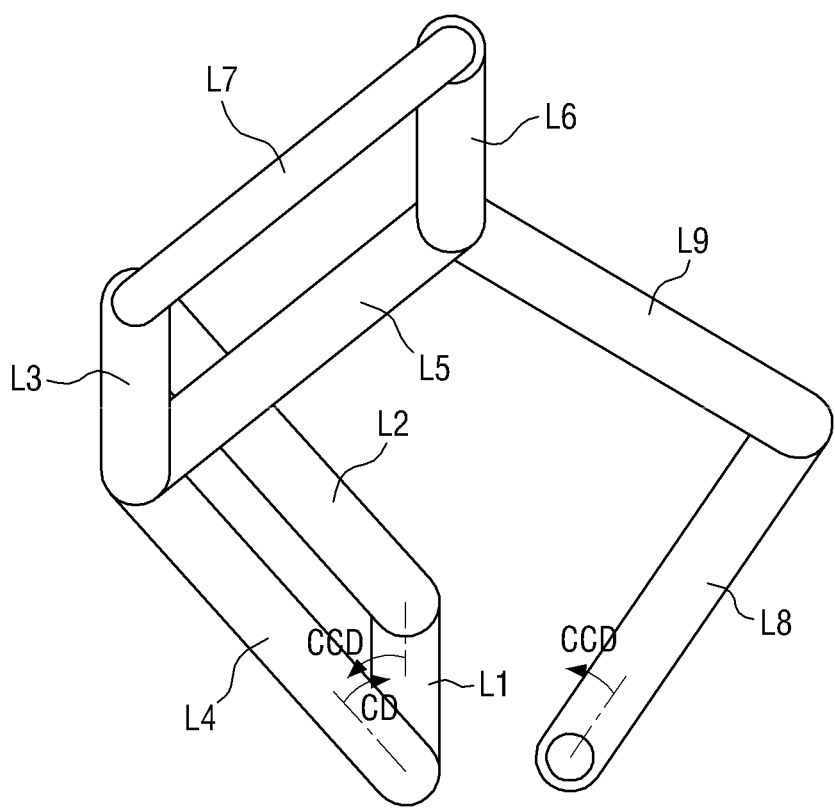
FIGS. 24 and 25 are views explaining an example of the operation of the link structure of FIG. 21.
Figure 25:
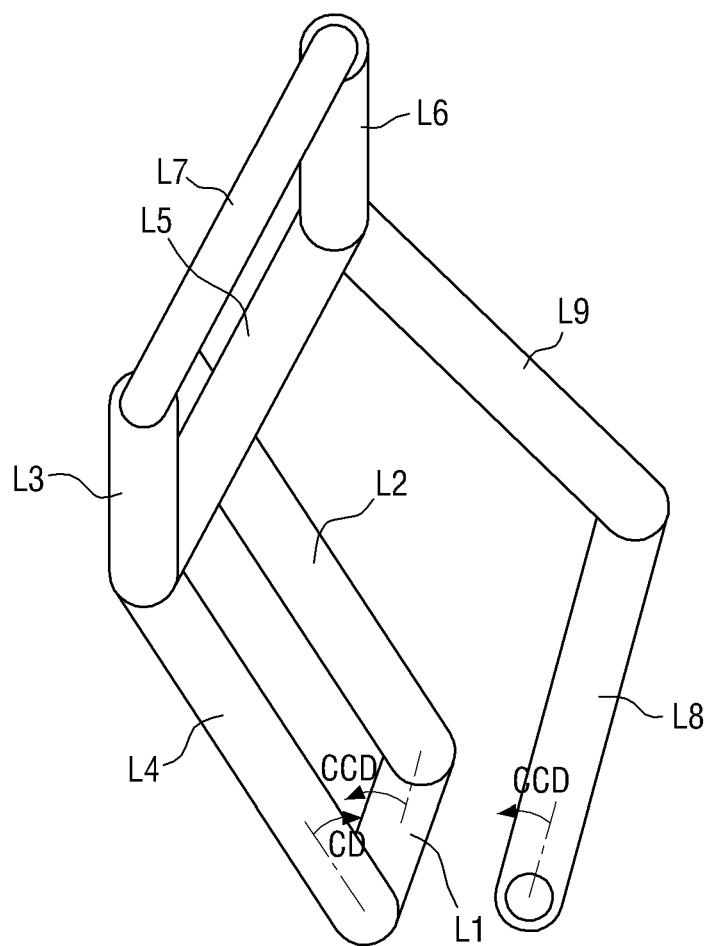
Figure 26:
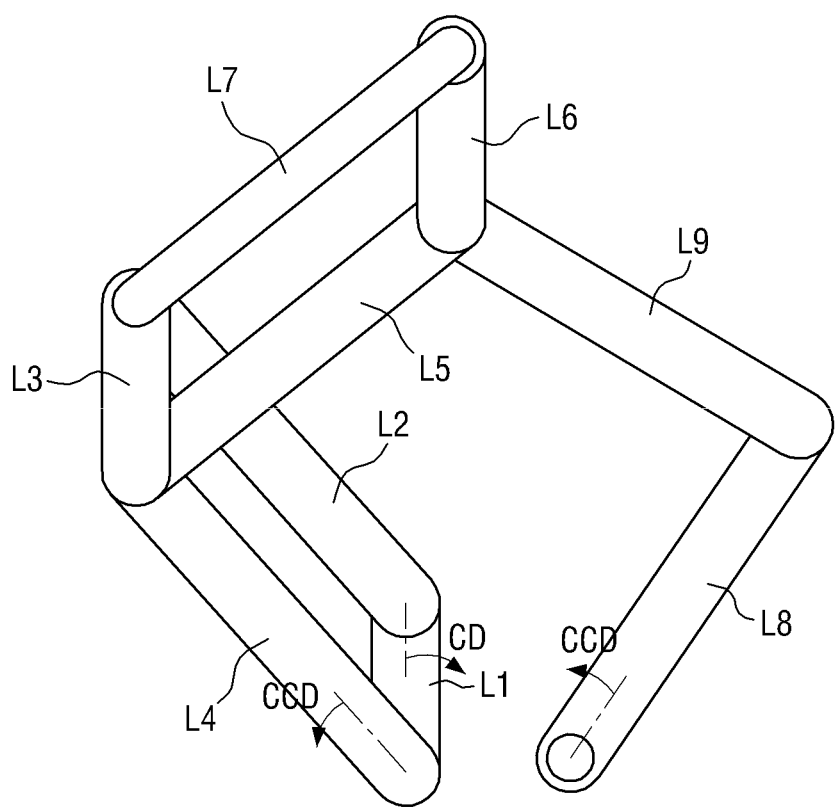
FIGS. 26 and 27 are views explaining another example of the operation of the link structure of FIG. 21.
Figure 27:
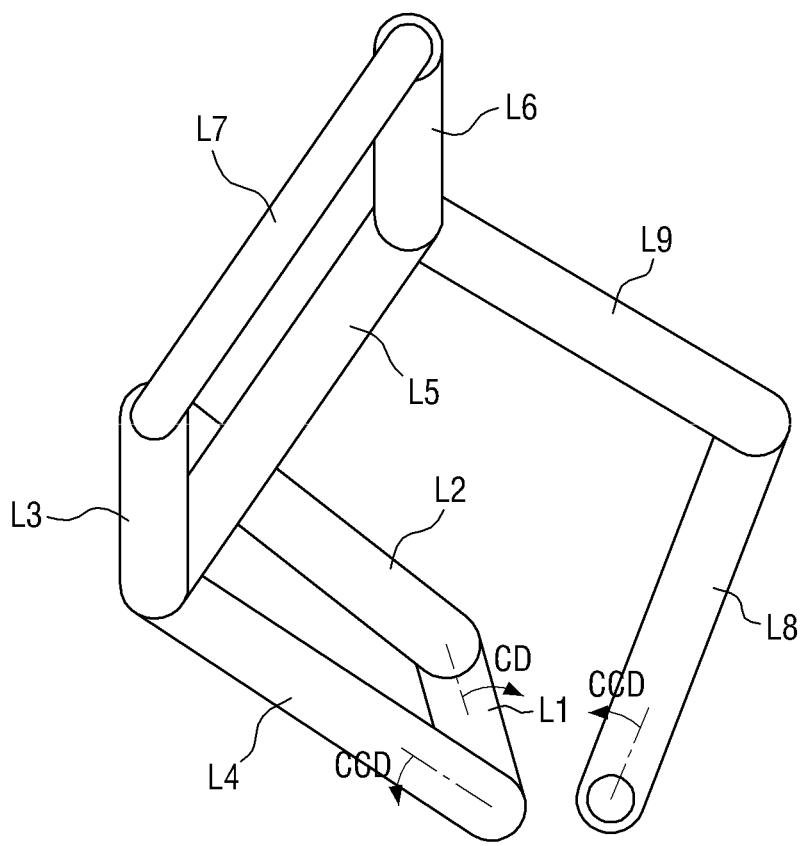

FIG. 21 is a conceptual view explaining a link structure according to yet still another exemplary embodiment. FIG. 22 is a cross-sectional view cut along line F-F of FIG. 21, and FIG. 23 is a cross-sectional view cut along line G-G of FIG. 21. FIGS. 24 and 25 are views explaining an example of the operation of the link structure of FIG. 21, and FIGS. 26 and 27 are views explaining another example of the operation of the link structure of FIG. 21.

First, referring to FIG. 21, a link structure 4 according to yet still another exemplary embodiment may include first to ninth links L1, L2, L3, L4, L5, L6, L7, L8 and L9.

The first link L1 may include ninth and tenth actuators M9 and M10 (in FIG. 22) and may be operated by the tenth actuator M10. Further, one end of the first link L1 may be connected to one end of the second link L2, and the other end thereof may be connected to one end of the fourth link L4.

Since the first link L1 includes the actuators M9 and M10 (in FIG. 22), the interior of the first link L1 should be kept in an atmospheric state. Accordingly, the interior of the first link L1 may be kept in the atmospheric state, and in order to maintain the atmospheric state, a magnetic fluid seal may be used.

In addition, since the first link L1 includes the actuators M9 and M10 (in FIG. 22) therein, the first link L1 may be thicker than other links, but is not limited thereto.

Referring to FIG. 22, the ninth actuator M9 may be positioned in the first link L1 and may be connected to a thirteenth rotary shaft 221. Further, the ninth actuator M9 may drive, e.g., rotate the fourth link L4 through rotation of the thirteenth rotary shaft 221.

The thirteenth rotary shaft 221 may connect the first link L1 and the fourth link L4 to each other. One end of the thirteenth rotary shaft 221 may be positioned in the first link L1, and the other end thereof may be positioned in the fourth link L4. Further, a part of the thirteenth rotary shaft 221 that is positioned between the first link L1 and the fourth link L4 may be surrounded and sealed by a thirteenth cover 222.

A magnetic fluid seal may be positioned between the thirteenth cover 222 and the thirteenth rotary shaft 221, but is not limited thereto.

A fourteenth rotary shaft 231 may connect the first link L1 and the second link L2 to each other. One end of the fourteenth rotary shaft 231 may be positioned in the first link L1, and the other end thereof may be positioned in the second link L2. Further, a part of the fourteenth rotary shaft 231 that is positioned between the first link L1 and the second link L2 may be surrounded and sealed by a fourteenth cover 232.

In addition, a magnetic fluid seal may be positioned between the fourteenth cover 232 and the fourteenth rotary shaft 231, but is not limited thereto.

The tenth actuator M10 may be positioned in the first link L1, and may be connected to a fifteenth rotary shaft 241. Further, the tenth actuator M10 may drive, e.g., rotate the first link L1 through rotation of the fifteenth rotary shaft 241.

A part of the fifteenth rotary shaft 241 may be positioned in the first link L1, and the remaining part thereof may be positioned outside the first link L1. Accordingly, the fifteenth rotary shaft 241 that projects to an outside may be surrounded by a fifteenth cover 242. Further, a magnetic fluid seal may be positioned between the fifteenth rotary shaft 241 and the fifteenth cover 242, but is not limited thereto.

Referring again to FIG. 21, the second link L2 may be connected to the first link L1.

Specifically, one end of the second link L2 may be connected to one end of the first link L1, and the other end thereof may be connected to one end of the third link L3. That is, one end of the second link L2 may be fixed to one end of the first link L1, and the other end thereof may be fixed to one end of the third link L3. Accordingly, the third link L3 may operate in the same manner as the first link L1.

As described above, since the second link L2 is connected to the first link L1 and the third link L3, the second link L2 may be one element of a four-bar link that includes the first to fourth links L1 to L4.

Further, the second link L2 may be provided on the upper portion of the first link L1. The third link L3 may be connected to the second link L2.

Specifically, one end of the third link L3 may be connected to the other end of the second link L2, and the other end thereof may be connected to one end of the fifth link L5. Further, one end of the third link L3 may be connected to one end of the seventh link L7, and the other end thereof may be connected to the other end of the fourth link L4. That is, the third link L3 may be provided on upper portions of the second link L2 and the fifth link L5.

As described above, since the third link L3 is connected to the second link L2, the third link L3 may be one element of a four-bar link that includes the first to fourth links L1 to L4. Further, since the third link L3 is connected to the fifth link L5, the third link L3 may be one element of a four-bar link that includes the third, fifth, sixth, and seventh links L3, L5, L6, and L7.

That is, the link structure 4 may have piled four-bar link structures through the above-described structure, and the third link L3 may serve as an auxiliary link that is commonly shared by respective four-bar link structures.

The fourth link L4 may be connected to the first link L1, and may be operated by the ninth actuator M9.

Specifically, the fourth link L4 may connect the first link L1 and the fifth link L5 to each other. That is, one end of the fourth link L4 may be connected to the other end of the first link L1, and the other end thereof may be connected to one end of the fifth link L5.

The fifth link L5 may be connected to the fourth link L4.

Specifically, the fifth link L5 may be connected to the third link L3, the fourth link L4, the sixth link L6, and the ninth link L9.

Accordingly, the fifth link L5 may be one element of a four-bar link that includes the third, fifth, sixth, and seventh links L3, L5, L6, and L7 and may connect to a two-bar link that includes the eighth and ninth links L8 and L9 and the piled four-bar link structure.

The sixth link L6 may connect the fifth link L5 and the seventh link L7.

Specifically, one end of the sixth link L6 may be connected to the other end of the fifth link L5, and the other end thereof may be connected to the other end of the seventh link L7. Accordingly, the sixth link L6 may be one element of a four-bar link that includes the third, fifth, sixth, and seventh links L3, L5, L6, and L7.

The seventh link L7 may connect the third link L3 and the sixth link L6.

Specifically, one end of the seventh link L7 may be connected to the other end of the third link L3, and the other end thereof may be connected to the other end of the sixth link L6. Accordingly, the seventh link L7 may be one element of a four-bar link that includes the third, fifth, sixth, and seventh links L3, L5, L6, and L7.

Further, one end of the seventh link L7 may be fixed to the other end of the third link L3, and the other end thereof may be fixed to the other end of the sixth link L6. Accordingly, the operation of the third link L3 may be controlled by the operation of the first link L1, and the operation of the sixth link L6 may be controlled by the operation of the third link L3.

The eighth link L8 may include an eleventh actuator M11 (in FIG. 23), and may be operated by the eleventh actuator M11. Further, the eighth link L8 may be connected to the ninth link L9.

Since the eighth link L8 includes the actuator M11 (in FIG. 23), the interior of the eighth link L8 should be kept in an atmospheric state. Accordingly, the interior of the eighth link L8 may be kept in the atmospheric state, and in order to maintain the atmospheric state, a magnetic fluid seal may be used. This feature will be described in detail later.

In addition, since the eighth link L8 includes the actuator M11 (in FIG. 23) therein, the eighth link L8 may be thicker than other links, but is not limited thereto.

Referring to FIG. 23, the eleventh actuator M11 may be positioned in the eighth link L8 and may be connected to a sixteenth rotary shaft 251. Further, the eleventh actuator M11 may drive, e.g., rotate the eighth link L8 through rotation of the sixteenth rotary shaft 251.

A part of the sixteenth rotary shaft 251 may be positioned in the eighth link L8, and the remaining part thereof may be positioned outside of the eighth link L8. The sixteenth rotary shaft 251 that projects to an outside may be surrounded by a sixteenth cover 252, and a magnetic fluid seal may be positioned between the sixteenth rotary shaft 251 and the sixteenth cover 252, but is not limited thereto.

A seventeenth rotary shaft 261 may connect the eighth link L8 and the ninth link L9 to each other. One end of the seventeenth rotary shaft 261 may be positioned in the eighth link L8, and the other end thereof may be positioned in the ninth link L9. Further, a part of the seventeenth rotary shaft 261 that is positioned between the eight link L8 and the ninth link L9 may be surrounded and sealed by a seventeenth cover 262.

In addition, a magnetic fluid seal may be positioned between a part of the seventeenth rotary shaft 261 and the seventeenth cover 262, but is not limited thereto.

Referring again to FIG. 21, the ninth link L9 may be connected to the eighth link L8.

Specifically, the ninth link L9 may connect the fifth link L5 and the eighth link L8 to each other. That is, one end of the ninth link L9 may be connected to the other end of the fifth link L5, and the other end thereof may be connected to one end of the eighth link L8.

As described above, the link structure 4 includes the piled four-bar link structure and two-bar link structure. The position and direction of the third link L3 may be determined by the driving of the first link L1 and the fourth link L4, and the position and direction of the sixth link L6 that is an output link of the third link L3 may be determined by the driving of the third link L3 and the eighth link L8. This feature will be described in detail later.

Further, since the link structure 4 includes the piled four-bar links and two-bar link, the link structure 4 may have a parallel type five-bar link structure.

FIGS. 24 and 25 illustrate how forward or backward motion of the link structure 4 of FIG. 21 is performed.

The sixth link L6 can perform forward or backward motion when the fourth link L4 is rotated in an opposite direction to the direction of the first and eighth links L1 and L8.

Specifically, for example, if the fourth link L4 is rotated in a clockwise direction CD and the first and eighth links L1 and L8 are rotated in a counterclockwise direction CCD, the sixth link L6 may perform the forward motion. Further, if the fourth link L4 is rotated in the counterclockwise direction CCD and the first and eighth links L1 and L8 are rotated in the clockwise direction CD, the sixth link L6 may perform the backward motion.

FIGS. 24 and 25 illustrate that the sixth link L6 performs the forward motion when the fourth link L4 is rotated in the clockwise direction CD and the first and eighth links L1 and L8 are rotated in the counterclockwise direction CCD.

In addition, if the fourth and eighth links L4 and L8 have the same angular velocity and the first and sixth links L1 and L6 are kept in parallel to each other, the forward or backward motion of the sixth link L6 may be performed, but exemplary embodiments are not limited thereto.

FIGS. 26 and 27 illustrate how left or right motion of the link structure 4 of FIG. 21 is performed.

The sixth link L6 can perform the left or right motion when the fourth and eighth links L4 and L8 are rotated in an opposite direction to the direction of the first link L1.

Specifically, for example, if the fourth and eighth links L4 and L8 are rotated in the counterclockwise direction CCD and the first link L1 is rotated in the clockwise direction CD, the sixth link L6 may move to the left. Further, if the fourth and eighth links L4 and L8 are rotated in the clockwise direction CD and the first link L1 is rotated in the counterclockwise direction CCD, the sixth link L6 may move to the right.

FIGS. 26 and 27 illustrate that the sixth link L6 moves to the left when the fourth and eighth links L4 and L8 are rotated in the counterclockwise direction CCD and the first link L1 is rotated in the clockwise direction CD.

In addition, if the amount of forward or backward motion of the end portion of the fourth link L4 when the fourth link L4 is rotated is equal to the amount of forward or backward motion of the eighth link L8 when the eighth link L8 is rotated, the sixth link L6 can perform the left or right motion without performing the forward or backward motion of the link structure 4, but exemplary embodiments are not limited thereto.

According to an exemplary embodiment, the term "equal to" may refer to not only "completely equal to" but also "including a difference within an error range".

Since the link structure 4 according to still another exemplary embodiment includes an actuator that is a drive source in a start portion, e.g., the first link L1 and the eighth link L8, rather than an end portion, the moment of inertia can be decreased. Further, since the load of the transported material is dispersed to the plurality of links, the link structure 4 can be lightweight. In addition, since an actuator or a power transfer component is not arranged in the remaining links except for the first and eighth links L1 and L8 of the link structure 4, the number of links which require sealing can be reduced, and thus the number of magnetic fluid seals can also be reduced. Accordingly, risks of atmospheric leakage and the manufacturing cost can be lowered.

Although exemplary embodiments have been described for illustrative purposes, those skilled in the art will appreciate that various modifications, additions and substitutions are possible, without departing from the scope and spirit of the invention as disclosed in the accompanying claims.

What is claimed is:

1. A link structure comprising:
a first link having a first link end;
a second link having a second link end that is connected to the first link end of the first link;
a third link having a third link end that is connected to the first link end of the first link, and provided on a portion of the second link;
a first rotary shaft partially provided in the first link;
a first actuator configured to rotate the first link about the first rotary shaft;
a second rotary shaft partially provided in the second link, the second rotary shaft being different from the first rotary shaft; and
a second actuator configured to rotate the second link about the second rotary shaft,
wherein the first actuator and the second actuator are embedded in the first link.

2. The link structure of claim 1, further comprising a first cover surrounding a part of the first rotary shaft that projects to an outside of the first link.

3. The link structure of claim 2, further comprising a magnetic fluid seal provided between the part of the first rotary shaft that projects to the outside of the first link and the first cover.

4. The link structure of claim 1, further comprising:
a third rotary shaft that is partially provided in the third link and is different from the first rotary shaft and the second rotary shaft; and
a third actuator configured to rotate the third link rotate about the third rotary shaft.

5. The link structure of claim 4, wherein the third actuator is provided in the first link.

6. The link structure of claim 4, further comprising a fourth link having a fourth link end that is connected to another second link end of the second link, and provided on the portion of the second link.

7. The link structure of claim 6, further comprising a fifth link connecting the third link and the fourth link to each other.

8. The link structure of claim 1, further comprising a fourth link having a fourth link end that is connected to another second link end of the second link, and provided on another portion of the second link, the another portion of the second link being different from the portion of the second link.

9. The link structure of claim 8, further comprising:
a fifth link connected to a different fourth link end of the fourth link;
a third rotary shaft that is partially provided in the fifth link and is different from the first rotary shaft and the second rotary shaft; and
a third actuator configured to rotate the fifth link rotate about the third rotary shaft.

10. The link structure of claim 9, wherein the third actuator is provided in the fifth link.

11. The link structure of claim 8, further comprising:
a fifth link connected to a different fourth link end of the fourth link; and
a sixth link having a sixth link end that is connected to the fourth link end of the fourth link, and arranged on the portion of the second link.

12. The link structure of claim 11, further comprising a seventh link connecting the third link and the sixth link to each other.

13. A link structure comprising:
a first link having a first link end;
a second link having a second link end that is connected to the first link end of the first link;
a third link having a third link end that is connected to the first link end of the first link, and provided on a portion of the second link;

a fourth link having a fourth link end that is connected to another second link end of the second link, and provided on the portion of the second link;
a first rotary shaft partially provided in the first link;
a first actuator configured to rotate the first link about the first rotary shaft;
a second rotary shaft partially provided in the second link, the second rotary shaft being different from the first rotary shaft; and
a second actuator configured to rotate the second link about the second rotary shaft,
wherein the first actuator and the second actuator are embedded in the first link.

14. The link structure of claim 13, further comprising:
a third rotary shaft that is partially provided in the third link and is different from the first rotary shaft and the second rotary shaft; and
a third actuator configured to rotate the second link about the third rotary shaft, the third actuator being provided in the first link.

15. The link structure of claim 14, further comprising a fifth link connecting the third link and the fourth link to each other.

16. A link structure, comprising:
a first link comprising a first driving component and a second driving component;
a second link connected to the first link, the second link being configured to be driven by the first driving component; and
a third link connected to the first link, the third link being configured to be driven by the second driving component,
wherein the second link and the third link exclude any driving components, and
wherein the first driving component and the second driving component are embedded within the first link.

17. The link structure of claim 16, wherein the first link is thicker than the second link and the third link based on a thickness of the first driving component and the second driving component embedded within the first link.

18. The link structure of claim 16, further comprising two additional links configured to connect the second link to the third link to enable the third link to control a rotational motion of the second link.

19. The link structure of claim 16, wherein the first link is heavier than the third link.

* * * * *